United States Patent
Chiang et al.

(10) Patent No.: US 12,015,065 B2
(45) Date of Patent: Jun. 18, 2024

(54) TRI-GATE ORTHOGONAL CHANNEL TRANSISTOR AND METHODS OF FORMING THE SAME

(71) Applicant: Taiwan Semiconductor Manufacturing Company Limited, Hsinchu (TW)

(72) Inventors: Katherine H. Chiang, New Taipei (TW); Chung-Te Lin, Taiwan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/358,289

(22) Filed: Jul. 25, 2023

(65) Prior Publication Data

US 2023/0369429 A1 Nov. 16, 2023

Related U.S. Application Data

(62) Division of application No. 17/229,758, filed on Apr. 13, 2021.
(Continued)

(51) Int. Cl.
*H01L 29/423* (2006.01)
*G11C 16/04* (2006.01)
(Continued)

(52) U.S. Cl.
CPC .... *H01L 29/42324* (2013.01); *G11C 16/0433* (2013.01); *G11C 16/10* (2013.01);
(Continued)

(58) Field of Classification Search
CPC ..... H01L 29/7869–78693; H01L 2924/13084; H01L 29/7831; H01L 29/66484
See application file for complete search history.

(56) References Cited

U.S. PATENT DOCUMENTS

2014/0185355 A1 7/2014 Juengling

FOREIGN PATENT DOCUMENTS

| JP | 2013093371 A | 5/2013 |
|---|---|---|
| KR | 20080038138 A | 5/2008 |

(Continued)

OTHER PUBLICATIONS

Taiwan Patent and Trademark Office, Application No. 110123561, Office Action dated Jan. 5, 2022, 3 pages.
(Continued)

*Primary Examiner* — Amar Movva
(74) *Attorney, Agent, or Firm* — The Marbury Law Group, PLLC

(57) ABSTRACT

A semiconductor device includes a metal oxide semiconductor channel layer, a first gate dielectric layer contacting a first portion of a major surface of the metal oxide semiconductor channel layer, a first gate electrode overlying the first gate dielectric layer and contacting a second portion of the major surface of the metal oxide semiconductor channel layer, a drain region and a backside gate dielectric layer contacting another major surface of the metal oxide semiconductor channel layer, a backside gate electrode contacting the backside gate dielectric layer, a second gate dielectric layer contacting an end surface of the metal oxide semiconductor channel layer, a second gate electrode contacting a surface of the second gate dielectric layer, and a source region contacting another end surface of the metal oxide semiconductor channel layer.

20 Claims, 37 Drawing Sheets

Related U.S. Application Data

(60) Provisional application No. 63/045,310, filed on Jun. 29, 2020.

(51) Int. Cl.
  *G11C 16/10* (2006.01)
  *G11C 16/26* (2006.01)
  *H01L 29/66* (2006.01)
  *H01L 29/786* (2006.01)
  *H01L 29/788* (2006.01)
  *H10B 41/10* (2023.01)
  *H10B 41/27* (2023.01)
  *H10B 41/35* (2023.01)

(52) U.S. Cl.
  CPC ........ *G11C 16/26* (2013.01); *H01L 29/66825* (2013.01); *H01L 29/7869* (2013.01); *H01L 29/7889* (2013.01); *H10B 41/10* (2023.02); *H10B 41/27* (2023.02); *H10B 41/35* (2023.02); *H01L 2924/13084* (2013.01)

(56) References Cited

FOREIGN PATENT DOCUMENTS

| KR | 20120031127 A | 3/2012 |
| TW | 201230247 A | 7/2012 |
| TW | 201507110 A | 2/2015 |
| TW | 201616613 A | 5/2016 |
| TW | 201733086 A | 9/2017 |
| TW | 202022437 A | 6/2020 |
| WO | 2019234547 A | 12/2019 |

OTHER PUBLICATIONS

Korean Patent and Trademark Office, Application No. 10-2021-0074848 Notice of Allowance dated Jun. 30, 2022, 6 pages.

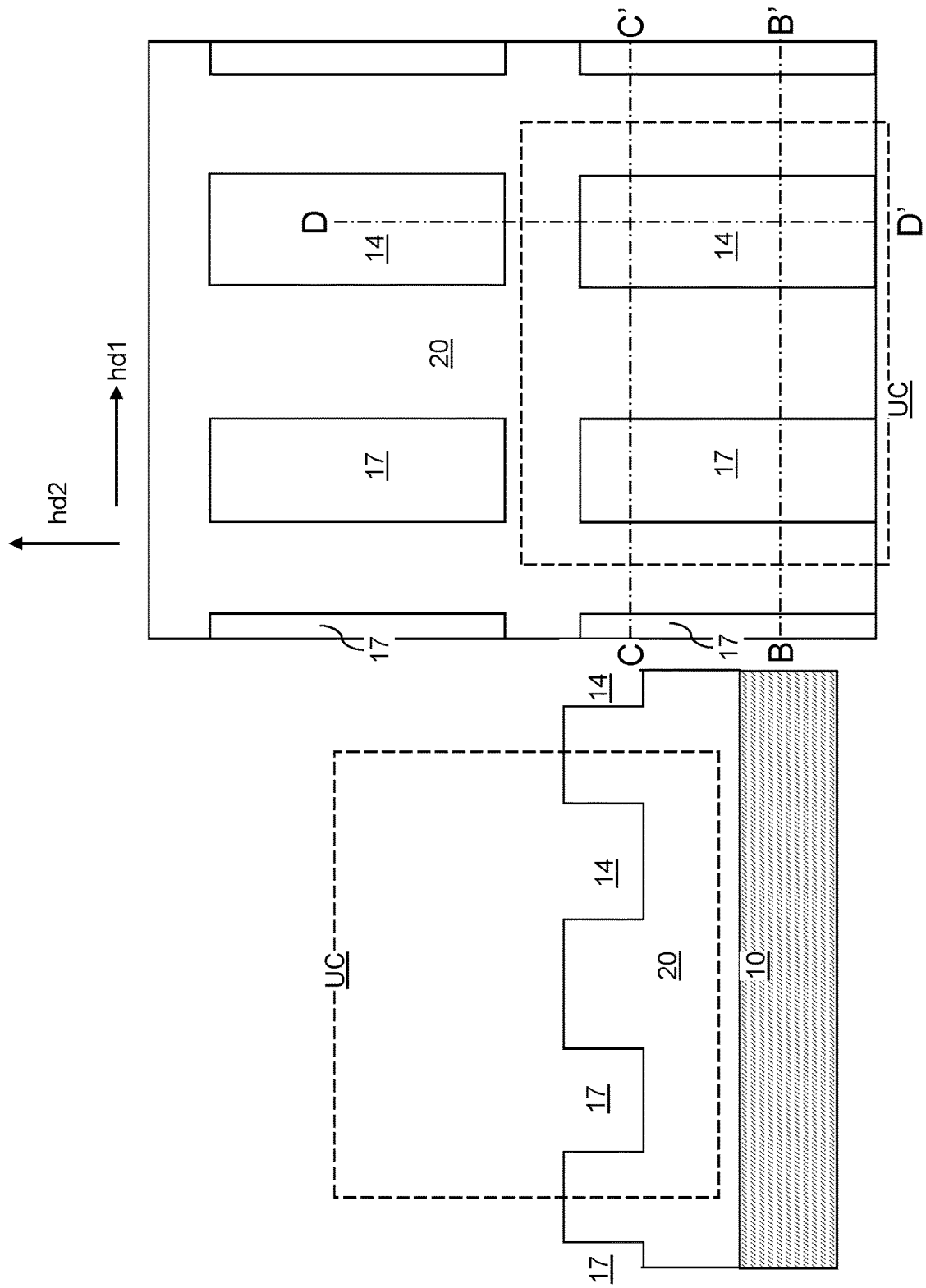

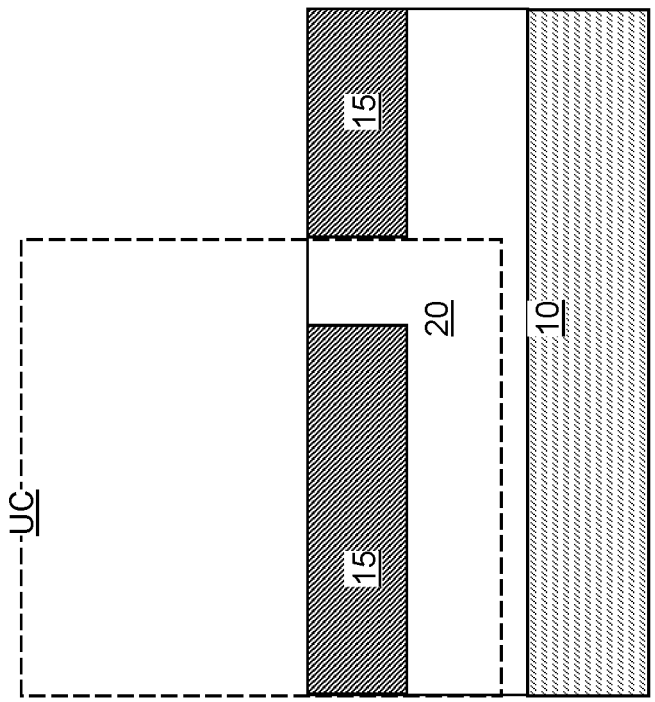
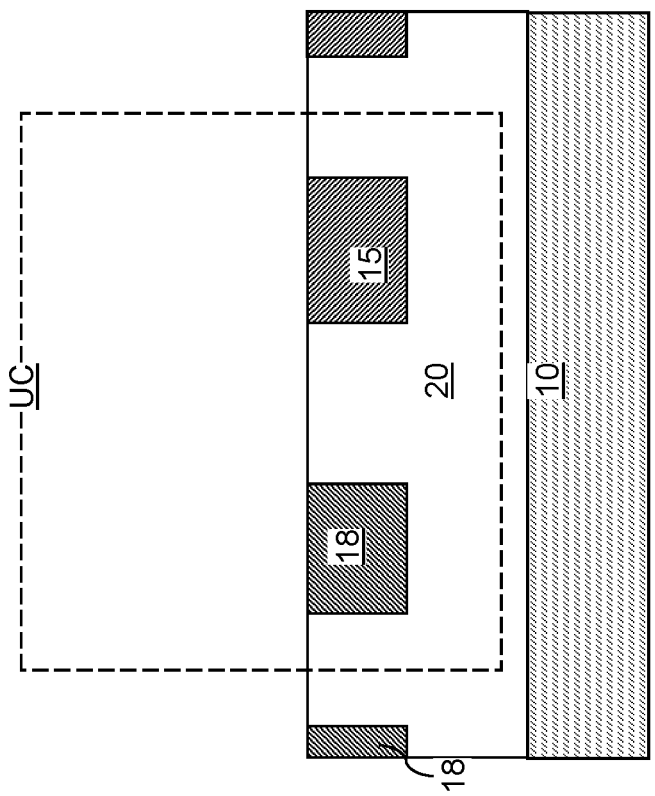
FIG. 2D
FIG. 2C

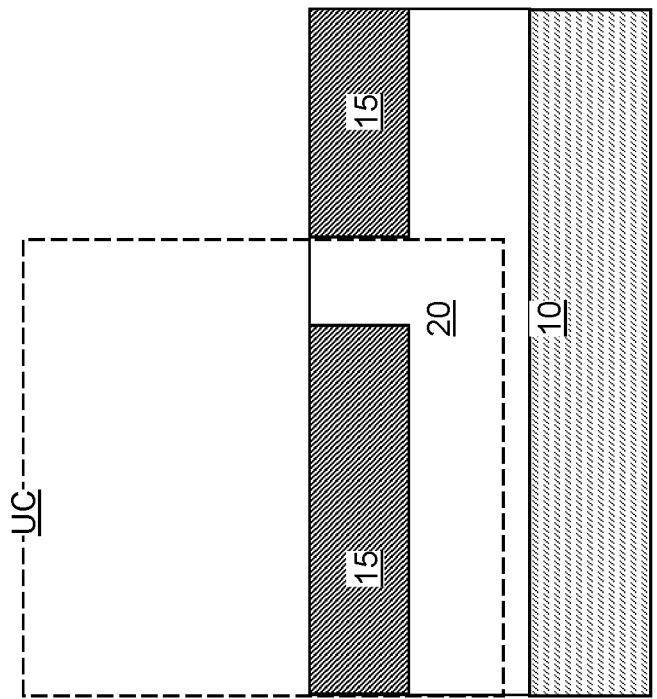
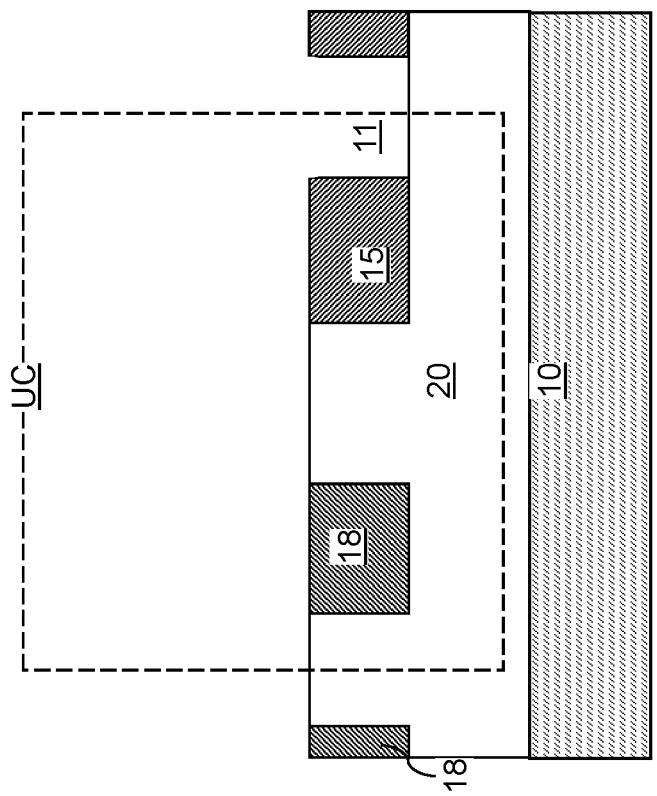
FIG. 3C
FIG. 3D

TRI-GATE ORTHOGONAL CHANNEL TRANSISTOR AND METHODS OF FORMING THE SAME

RELATED APPLICATIONS

This application is a divisional application of U.S. application Ser. No. 17/229,758 entitled "Tri-Gate Orthogonal Channel Transistor and Methods of Forming the Same," filed on Apr. 13, 2021, which claims the benefit of priority from U.S. Provisional Application No. 63/045,310 entitled "Dual-Gated Orthogonal Metal Gate Devices," filed on Jun. 29, 2020, the entire contents of both of which are hereby incorporated by reference for all purposes.

BACKGROUND

Memory devices that use stored electrical charges include volatile dynamic random access memory devices. Such volatile dynamic random access memory devices require periodic refreshing of the stored electrical charges. Other memory devices might include nonvolatile flash memory devices that use charge tunneling. While flash memory devices may be advantageous as they are nonvolatile devices, the flash memory devices are prone to device performance degradation over time after repeated usage. The repeated usage over time causes cumulative damage to the tunneling dielectric. Thus, a nonvolatile memory device that may provide longer endurance than flash memory devices is desirable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a top-down view of a first exemplary structure after formation of drain recess regions and gate recess regions in an insulating matrix layer according to an embodiment of the present disclosure.

FIG. 1B is a vertical cross-sectional of the first exemplary structure along the vertical plane B-B' of FIG. 1A.

FIG. 2C is a vertical cross-sectional of the first exemplary structure along the vertical plane C-C' of FIG. 2A.

FIG. 2D is a vertical cross-sectional of the first exemplary structure along the vertical plane D-D' of FIG. 2A.

FIG. 3C is a vertical cross-sectional of the first exemplary structure along the vertical plane C-C' of FIG. 3A.

FIG. 3D is a vertical cross-sectional of the first exemplary structure along the vertical plane D-D' of FIG. 3A.

DETAILED DESCRIPTION

Figure 1D:
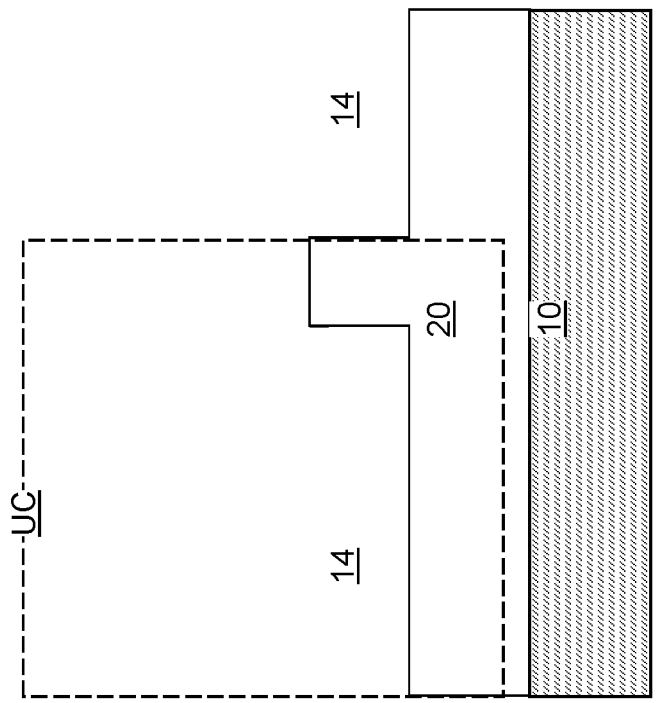
FIG. 1D is a vertical cross-sectional of the first exemplary structure along the vertical plane D-D' of FIG. 1A.
Figure 1C:
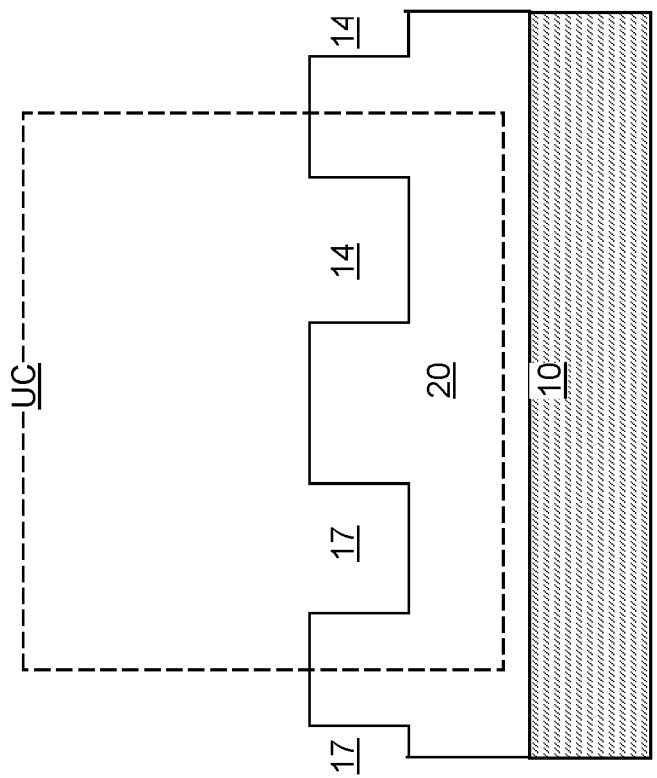
FIG. 1C is a vertical cross-sectional of the first exemplary structure along the vertical plane C-C' of FIG. 1A.
Figure 2A:
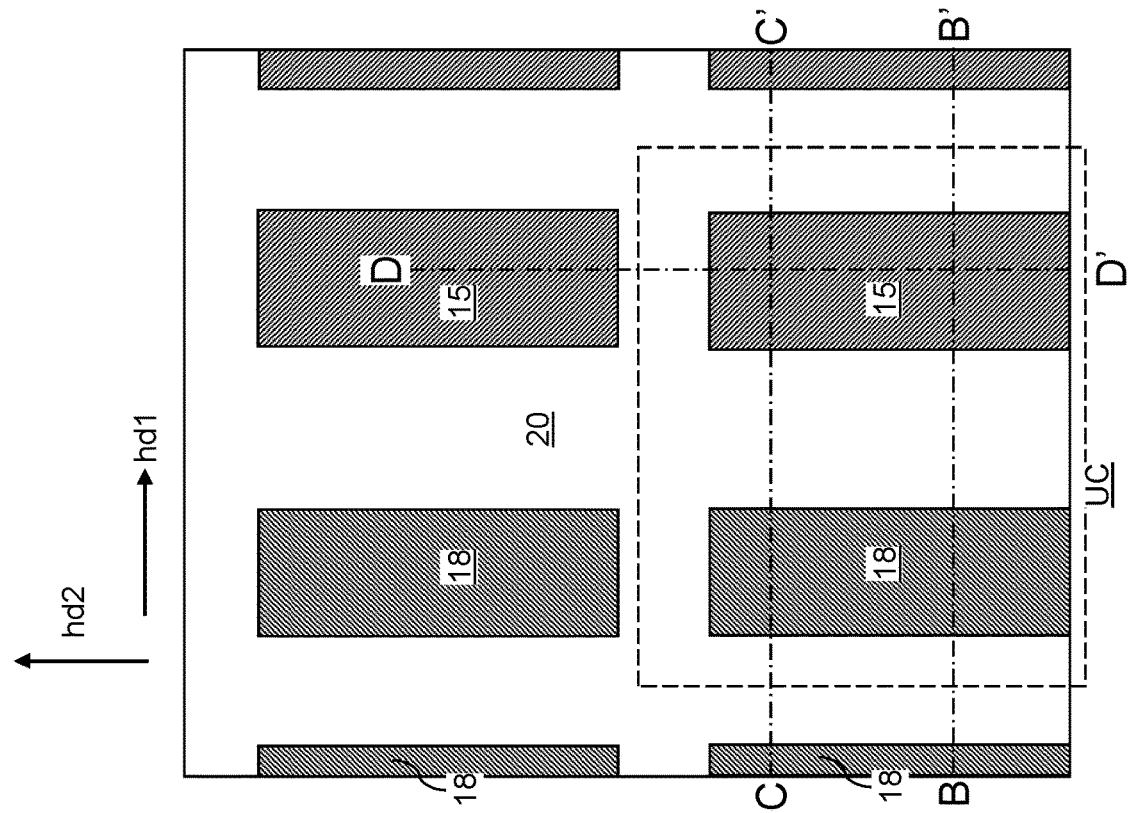
FIG. 2A is a top-down view of the first exemplary structure after formation of drain regions and backside gate electrodes in the insulating matrix layer according to an embodiment of the present disclosure.
Figure 2B:
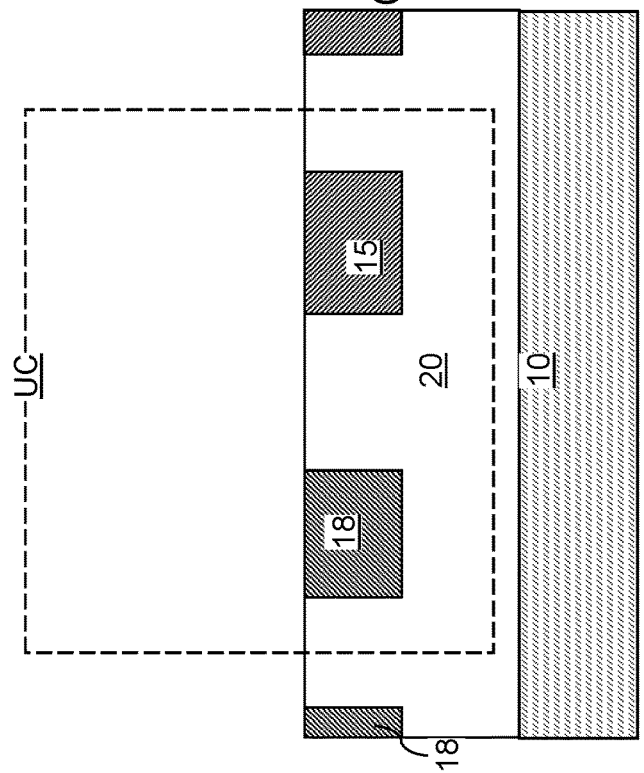
FIG. 2B is a vertical cross-sectional of the first exemplary structure along the vertical plane B-B' of FIG. 2A.
Figure 3A:
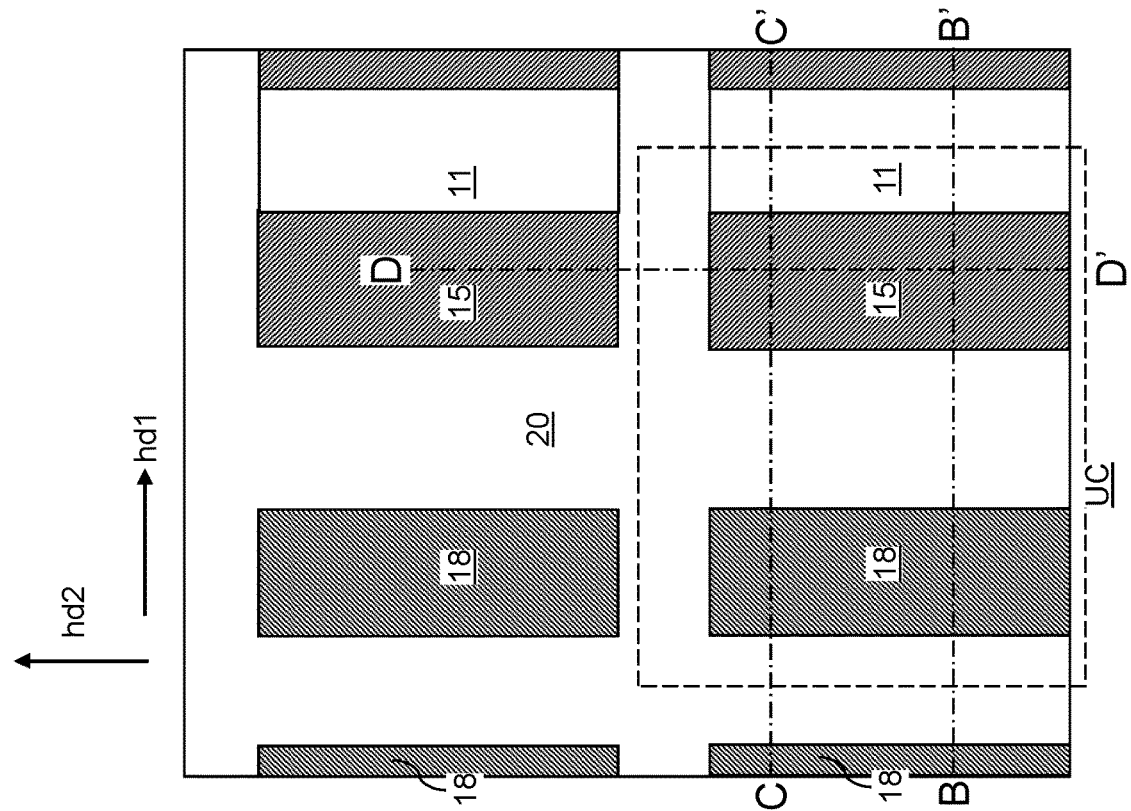
FIG. 3A is a top-down view of the first exemplary structure after formation of source recess regions in the insulating matrix layer according to an embodiment of the present disclosure.
Figure 3B:
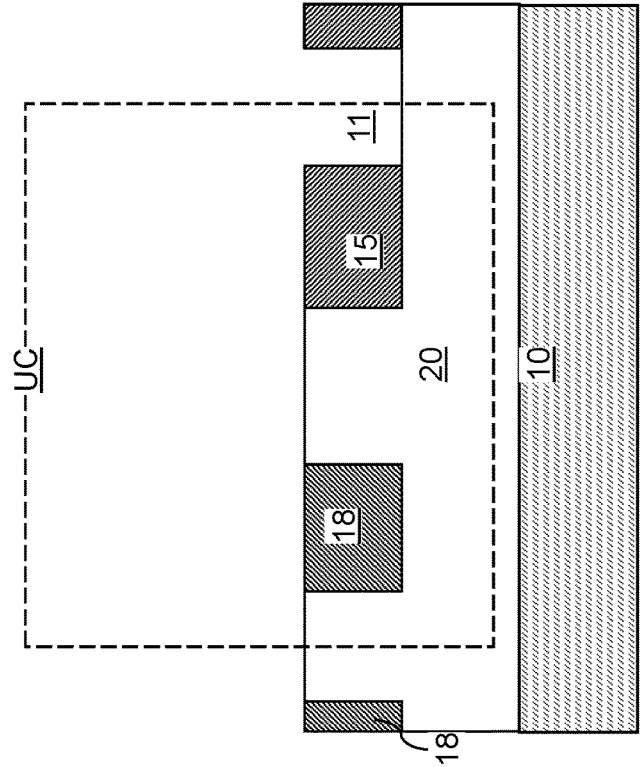
FIG. 3B is a vertical cross-sectional of the first exemplary structure along the vertical plane B-B' of FIG. 3A.
Figure 4A:
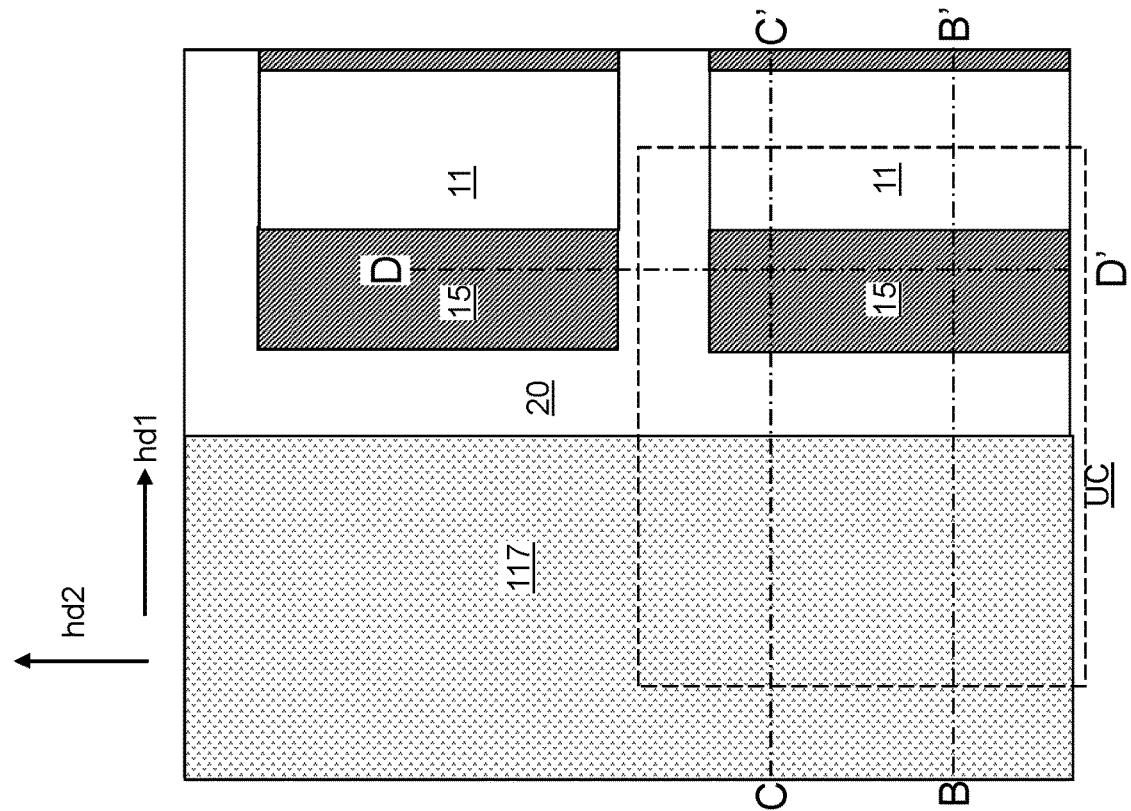
FIG. 4A is a top-down view of the first exemplary structure after trimming the backside gate electrodes according to an embodiment of the present disclosure.
Figure 4B:
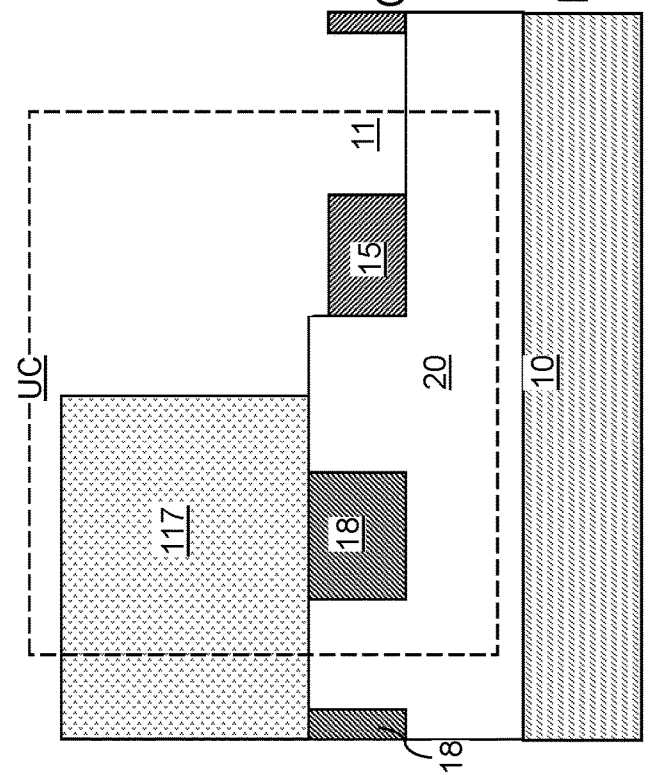
FIG. 4B is a vertical cross-sectional of the first exemplary structure along the vertical plane B-B' of FIG. 4A.
Figure 4C:
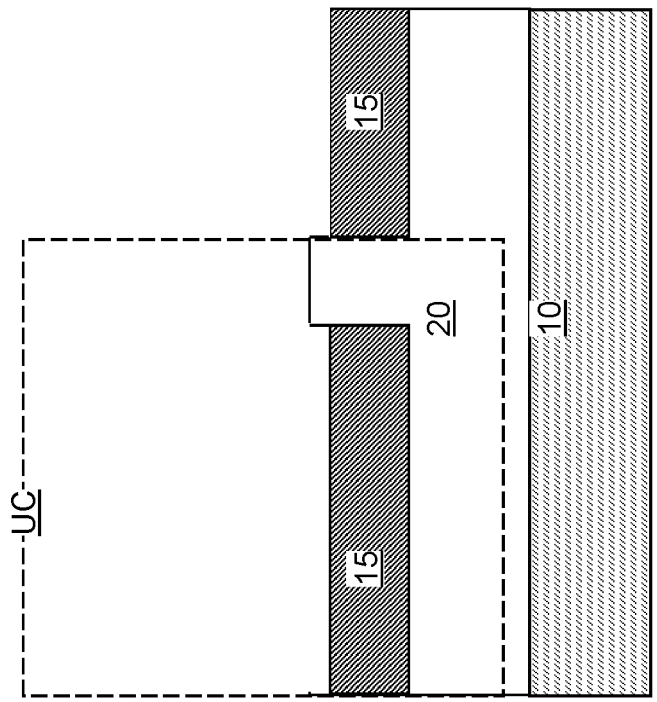
FIG. 4C is a vertical cross-sectional of the first exemplary structure along the vertical plane C-C' of FIG. 4A.
Figure 4D:
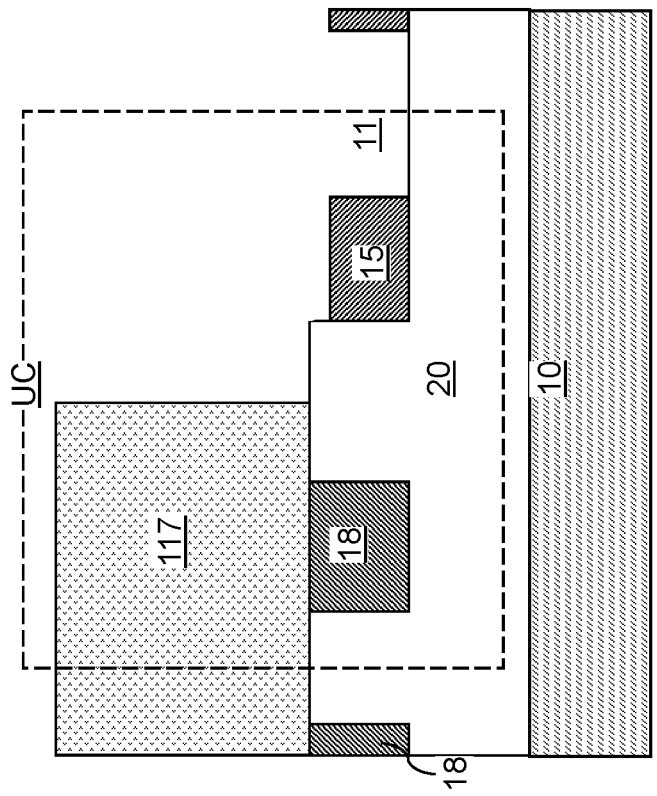
FIG. 4D is a vertical cross-sectional of the first exemplary structure along the vertical plane D-D' of FIG. 4A.
Figure 5A:
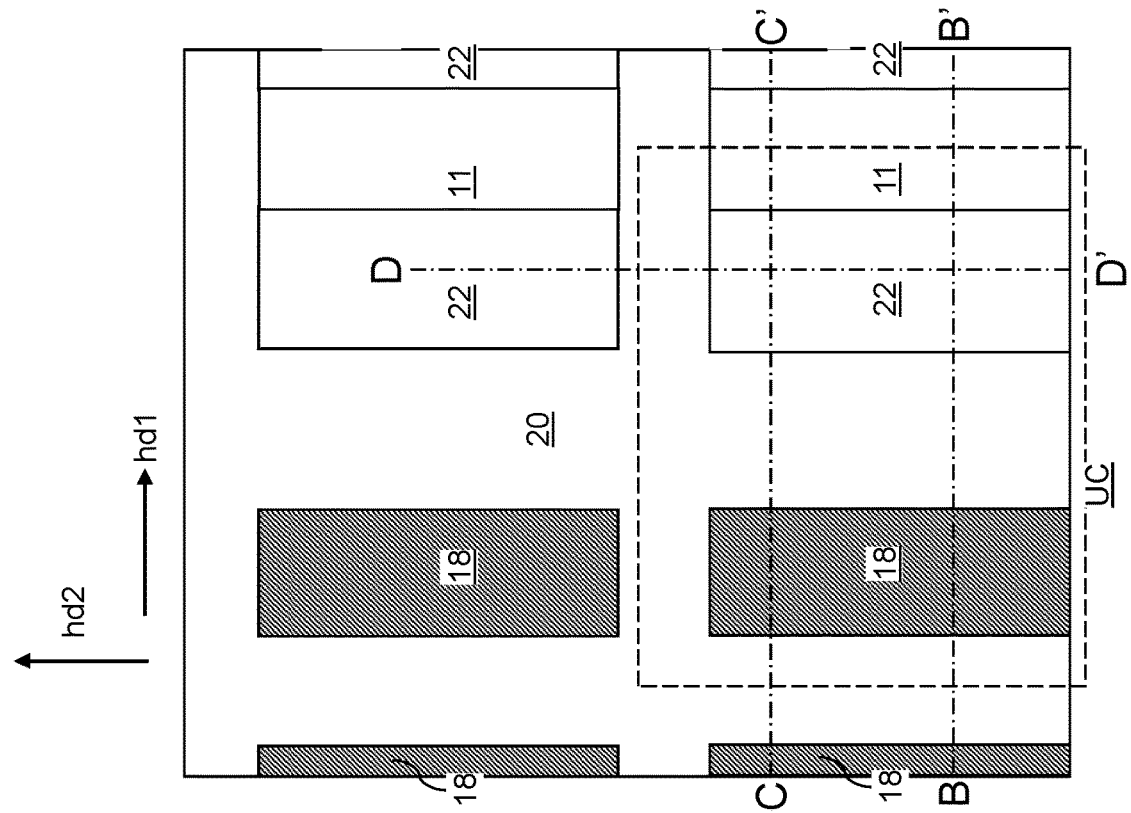
FIG. 5A is a top-down view of the first exemplary structure after formation of backside gate dielectric layers in the insulating matrix layer according to an embodiment of the present disclosure.
Figure 5B:
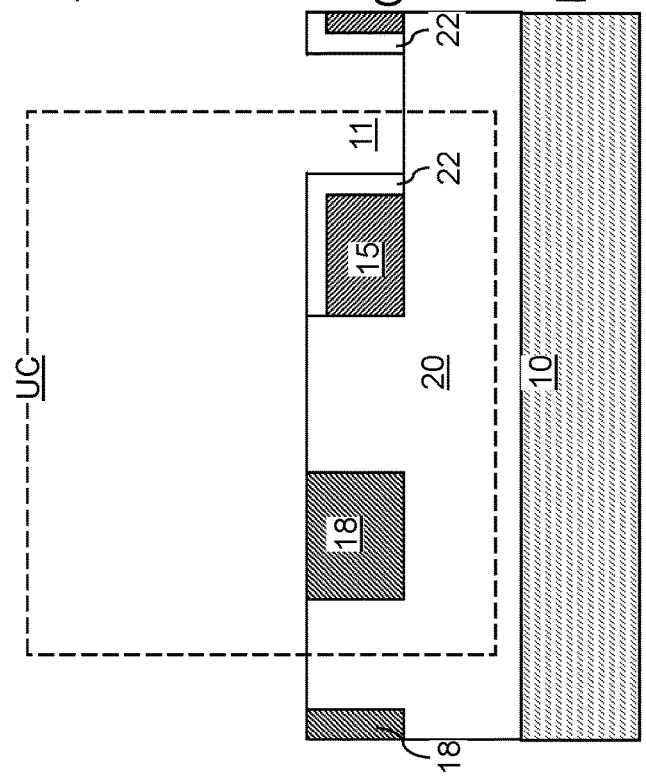
FIG. 5B is a vertical cross-sectional of the first exemplary structure along the vertical plane B-B' of FIG. 5A.
Figure 5D:
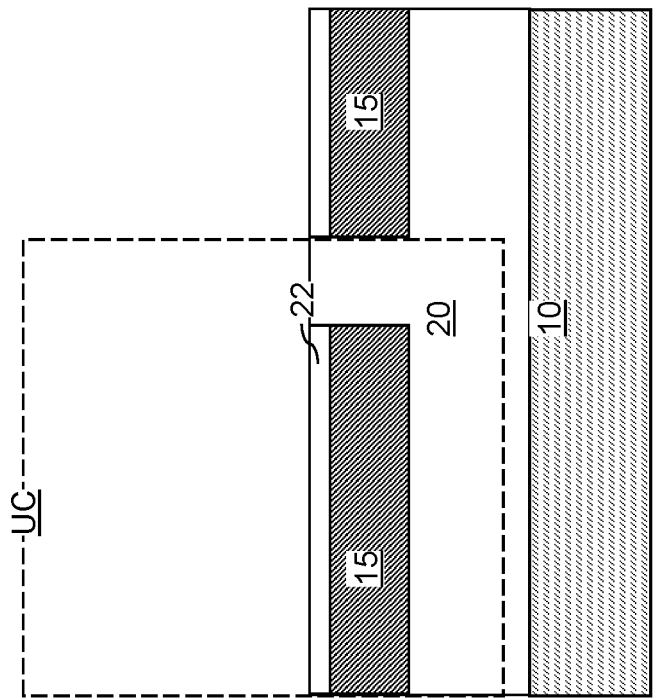
FIG. 5D is a vertical cross-sectional of the first exemplary structure along the vertical plane D-D' of FIG. 5A.
Figure 5C:
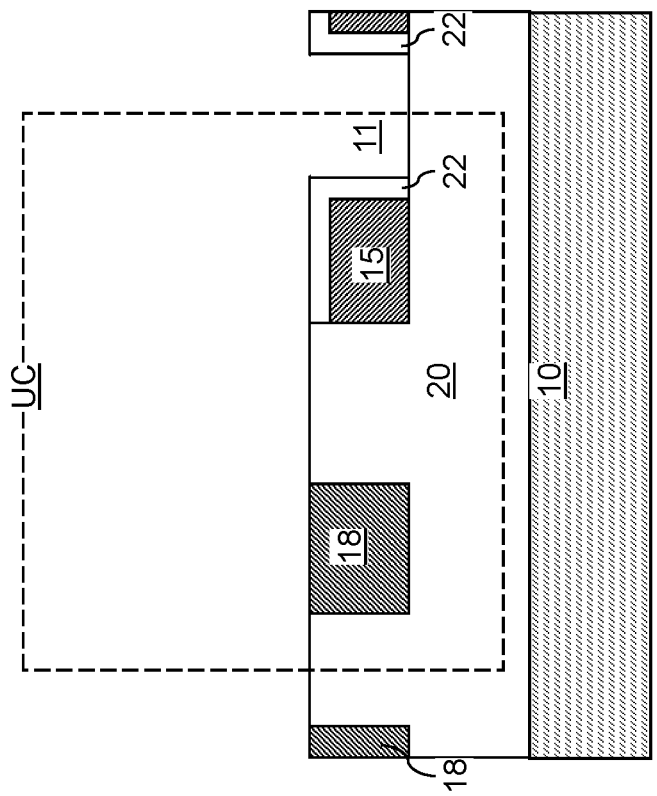
FIG. 5C is a vertical cross-sectional of the first exemplary structure along the vertical plane C-C' of FIG. 5A.
Figure 6A:
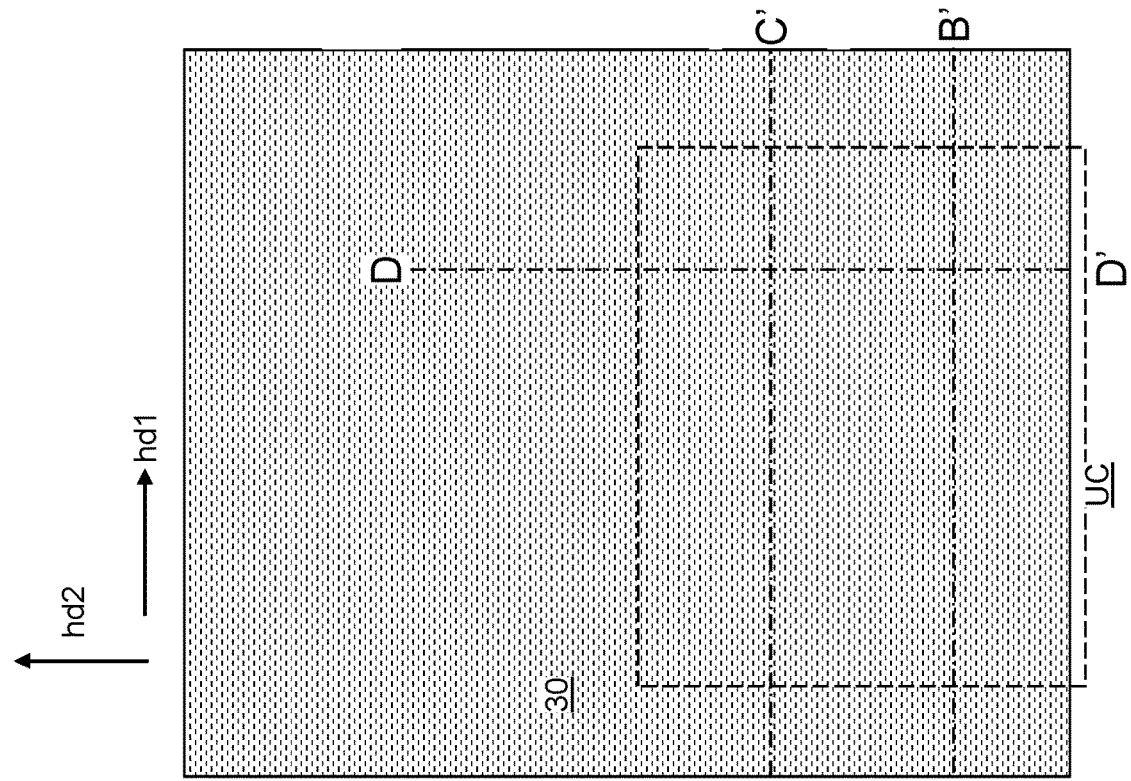
FIG. 6A is a top-down view of the first exemplary structure after formation of first portions of source regions and metal oxide semiconductor channel layer according to an embodiment of the present disclosure.
Figure 6B:
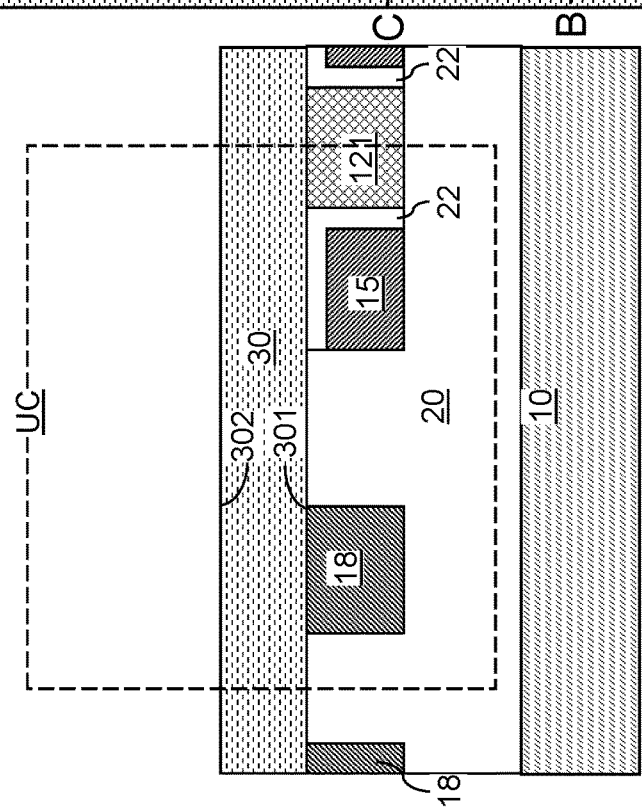
FIG. 6B is a vertical cross-sectional of the first exemplary structure along the vertical plane B-B' of FIG. 6A.
Figure 6D:
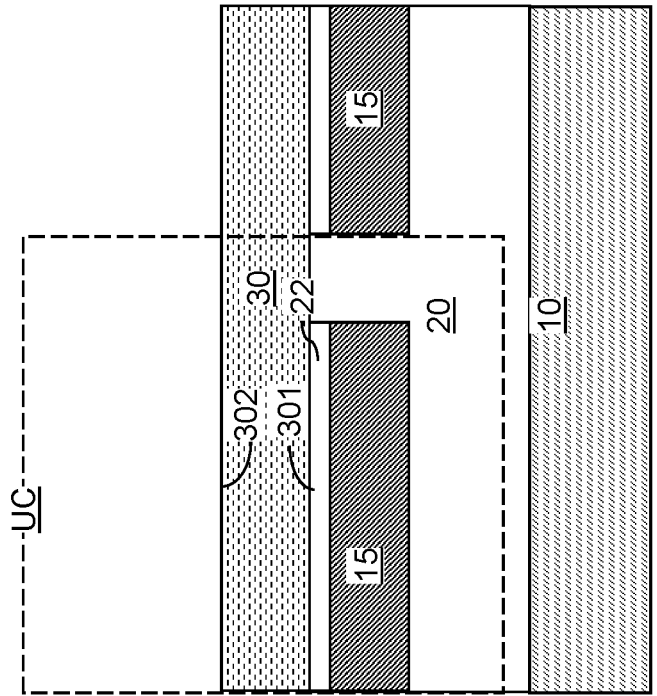
FIG. 6D is a vertical cross-sectional of the first exemplary structure along the vertical plane D-D' of FIG. 6A.
Figure 6C:
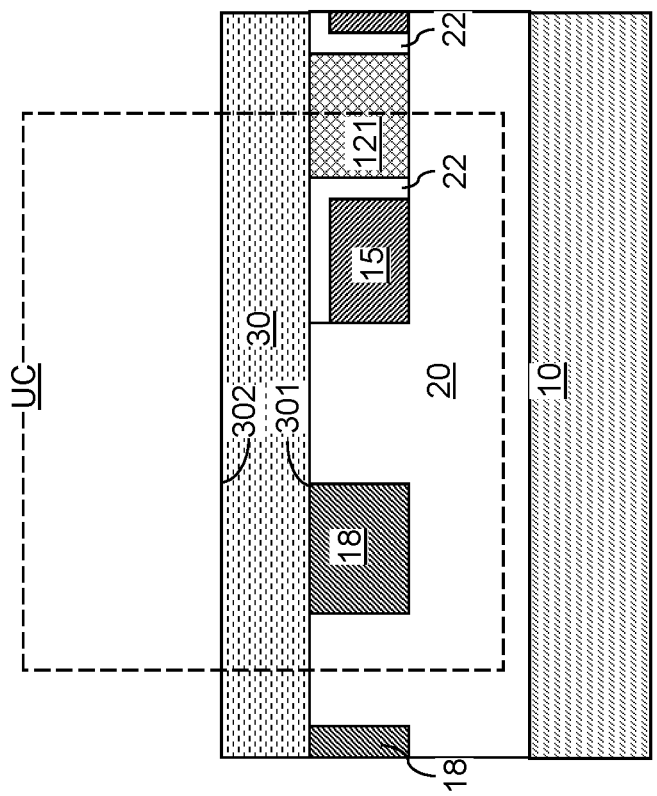
FIG. 6C is a vertical cross-sectional of the first exemplary structure along the vertical plane C-C' of FIG. 6A.
Figures 7A, 7B:
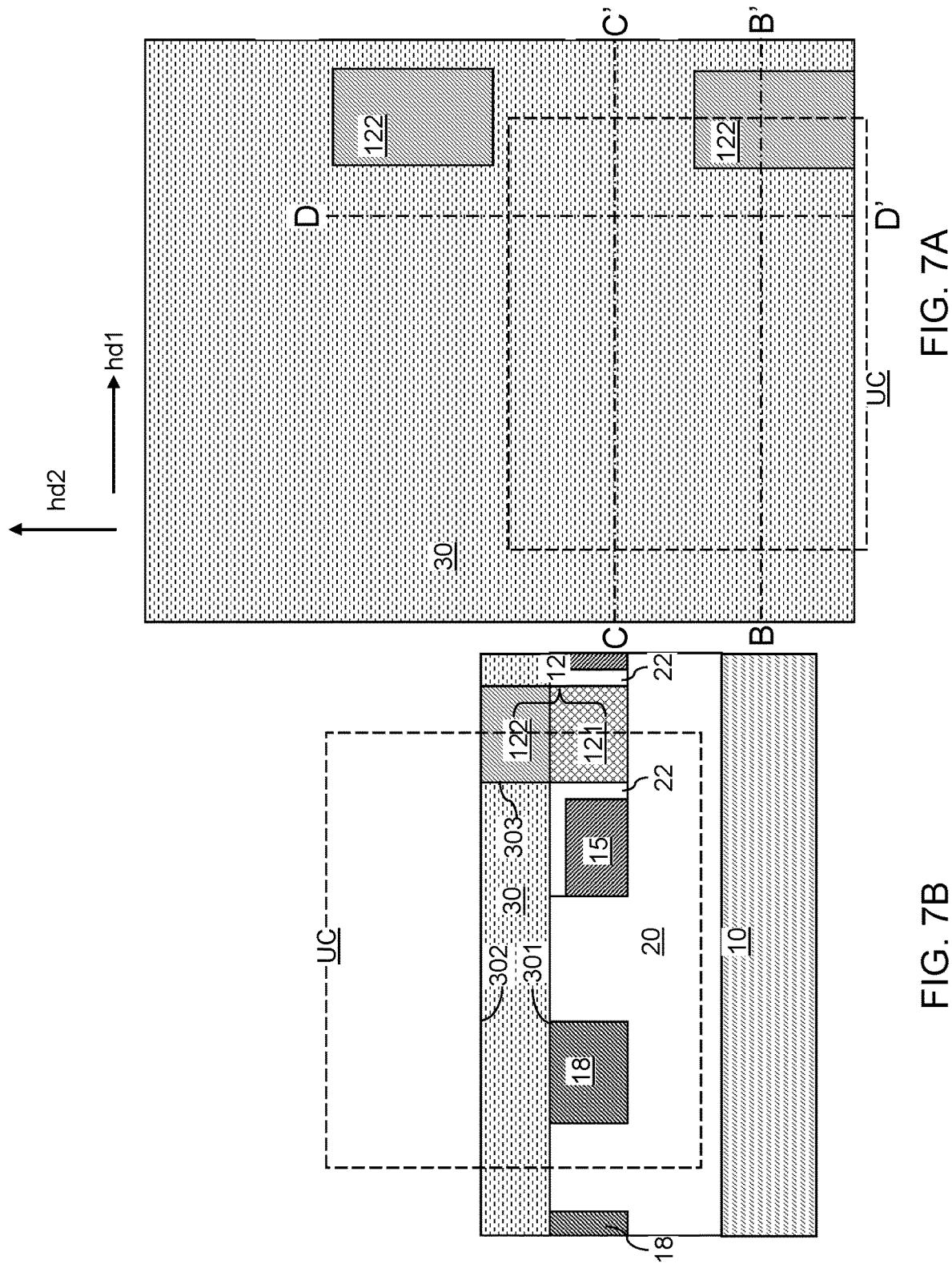
FIG. 7A is a top-down view of the first exemplary structure after formation of second portions of source regions in the insulating matrix layer according to an embodiment of the present disclosure.
FIG. 7B is a vertical cross-sectional of the first exemplary structure along the vertical plane B-B' of FIG. 7A.
Figure 7D:
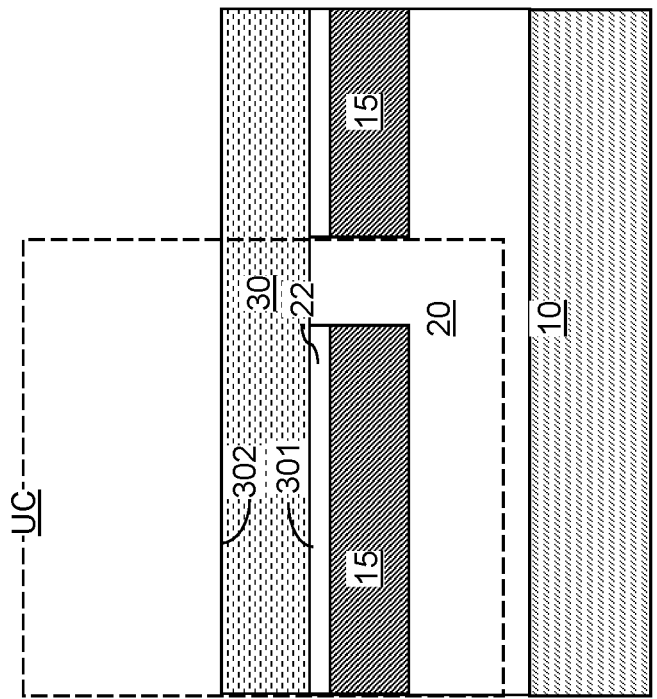
FIG. 7D is a vertical cross-sectional of the first exemplary structure along the vertical plane D-D' of FIG. 7A.
Figure 7C:
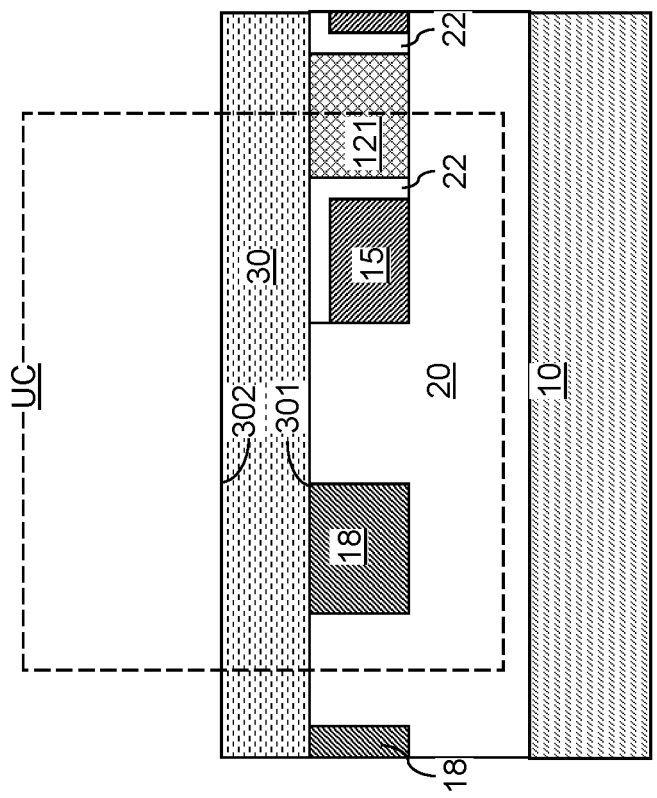
FIG. 7C is a vertical cross-sectional of the first exemplary structure along the vertical plane C-C' of FIG. 7A.
Figure 8A:
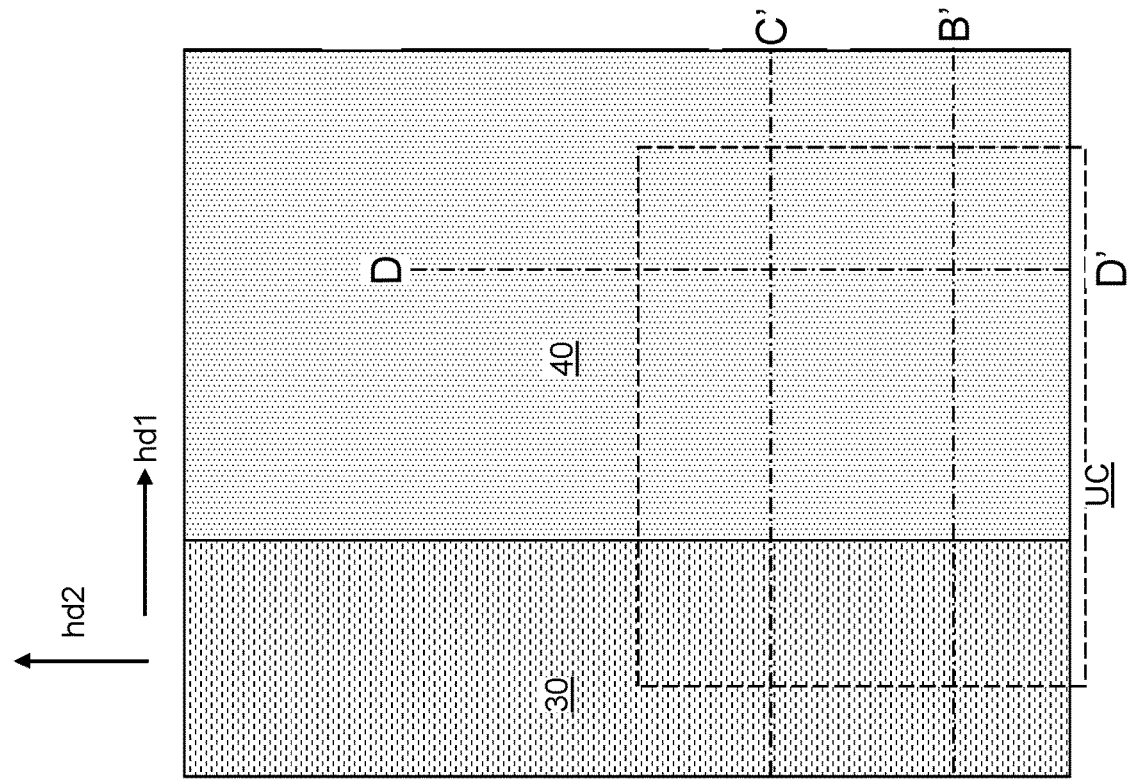
FIG. 8A is a top-down view of the first exemplary structure after deposition of the first gate dielectric material layer according to an embodiment of the present disclosure.
Figure 8B:
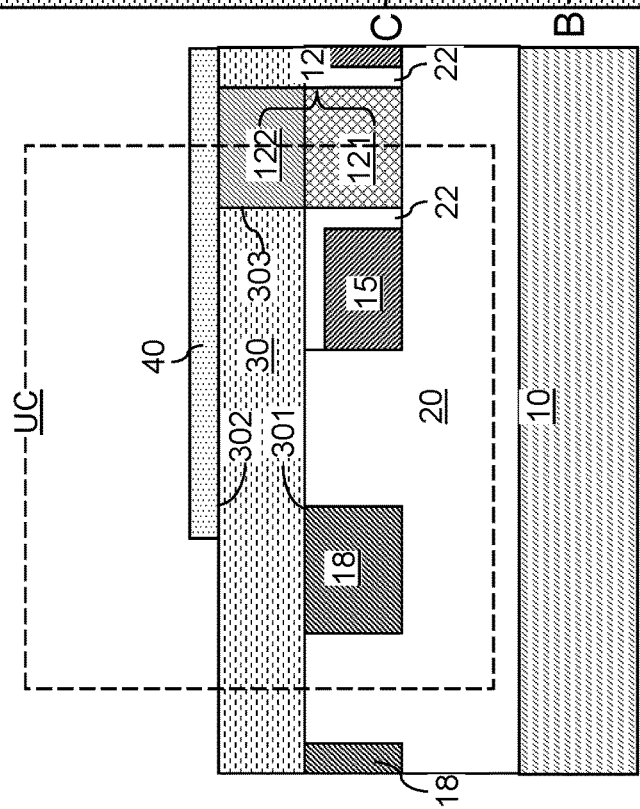
FIG. 8B is a vertical cross-sectional of the first exemplary structure along the vertical plane B-B' of FIG. 8A.
Figure 8D:
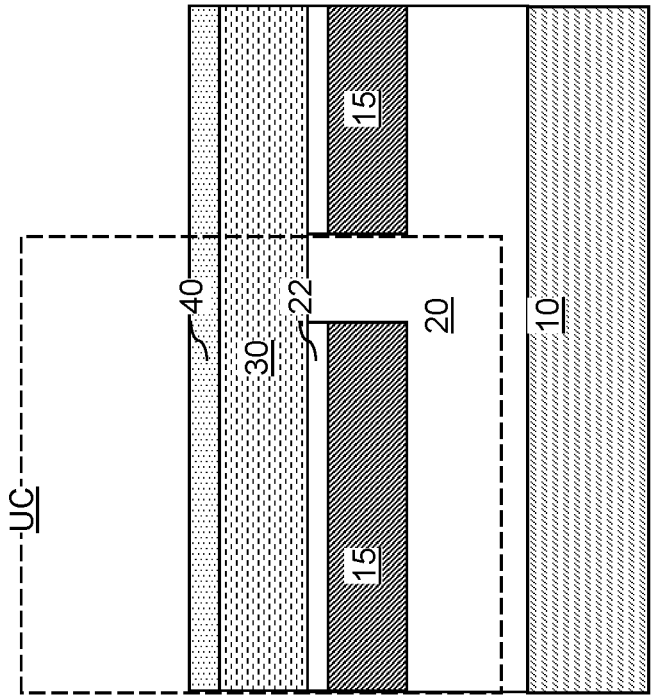
FIG. 8D is a vertical cross-sectional of the first exemplary structure along the vertical plane D-D' of FIG. 8A.
Figure 8C:
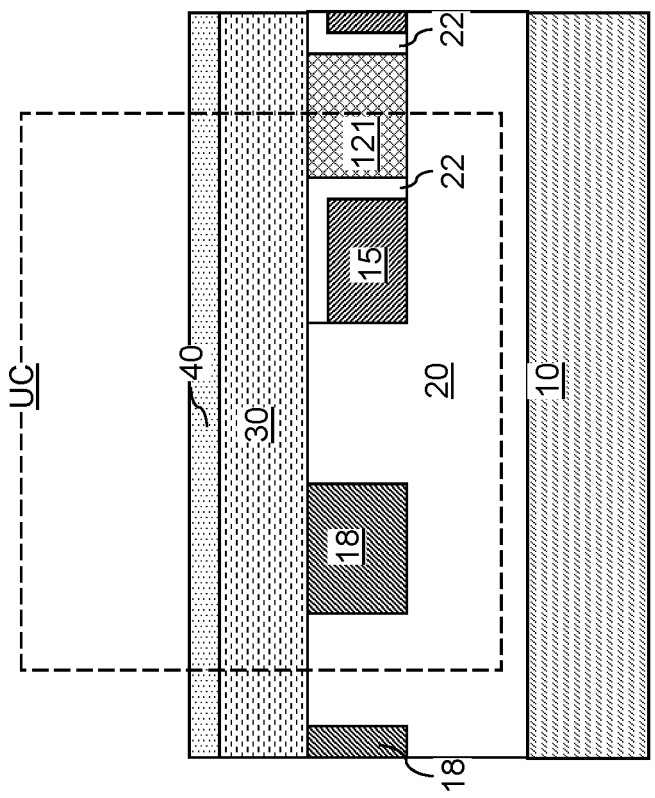
FIG. 8C is a vertical cross-sectional of the first exemplary structure along the vertical plane C-C' of FIG. 8A.
Figure 9A:
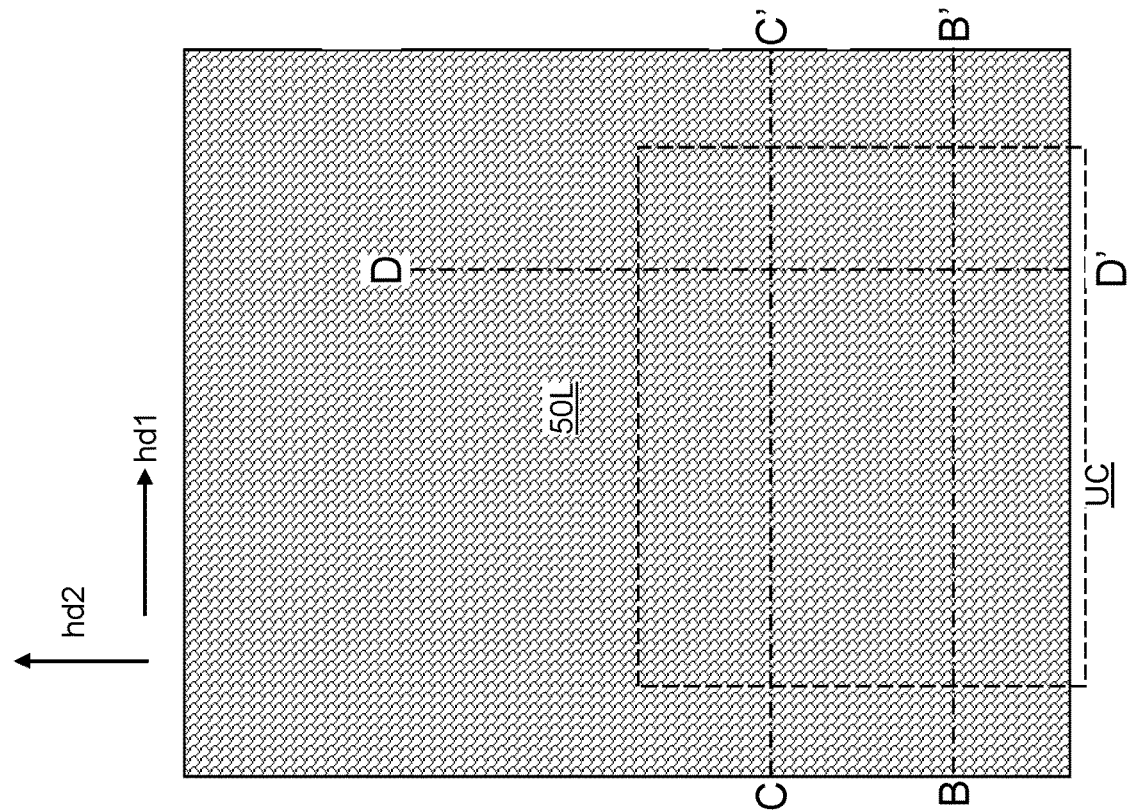
FIG. 9A is a top-down view of the first exemplary structure after formation of the first gate electrode material layer according to an embodiment of the present disclosure.
Figure 9B:
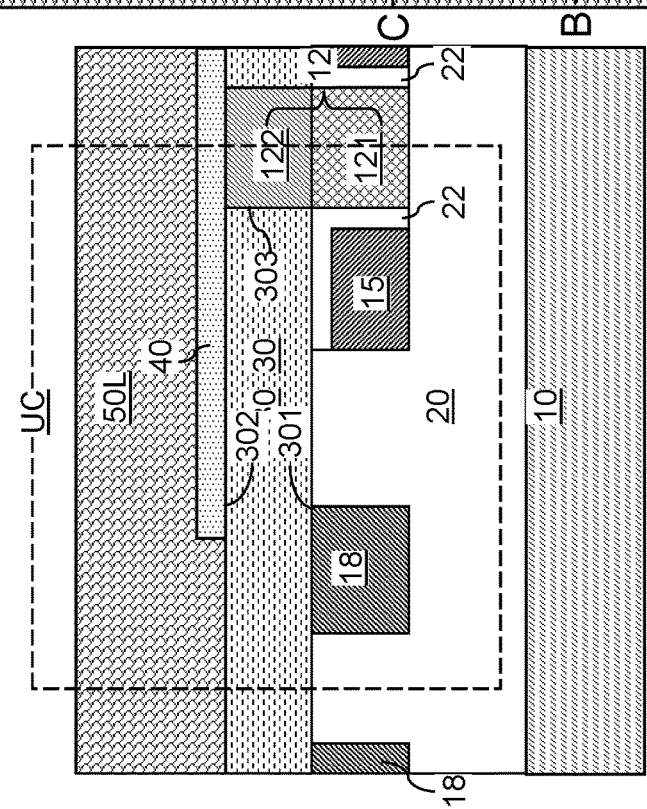
FIG. 9B is a vertical cross-sectional of the first exemplary structure along the vertical plane B-B' of FIG. 9A.
Figure 9D:
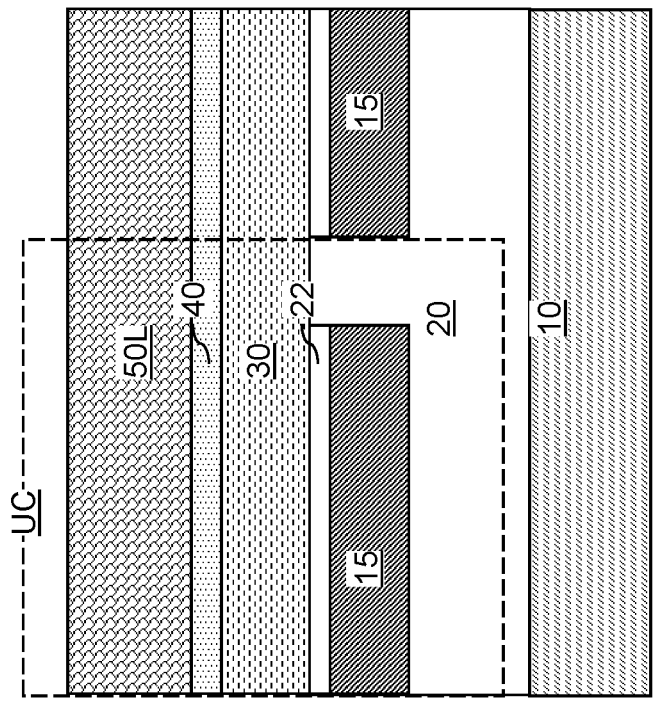
FIG. 9D is a vertical cross-sectional of the first exemplary structure along the vertical plane D-D' of FIG. 9A.
Figure 9C:
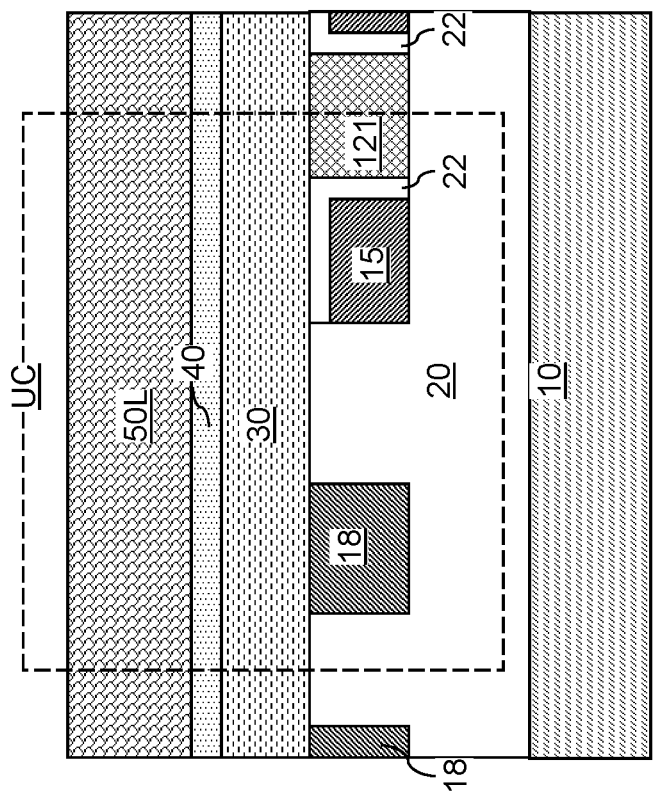
FIG. 9C is a vertical cross-sectional of the first exemplary structure along the vertical plane C-C' of FIG. 9A.
Figures 10A, 10B:
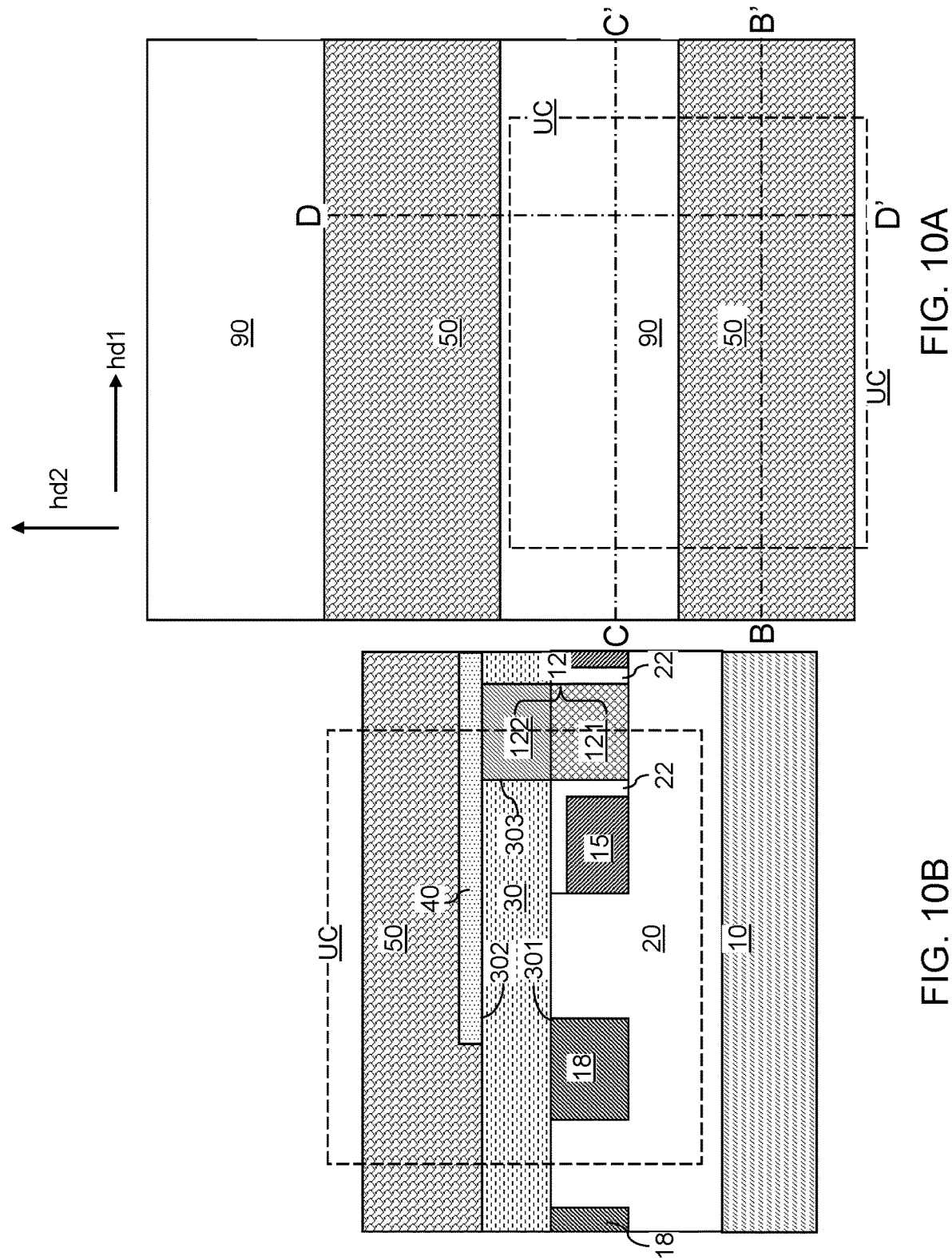
FIG. 10A is a top-down view of the first exemplary structure after formation of dielectric rails according to an embodiment of the present disclosure.
FIG. 10B is a vertical cross-sectional of the first exemplary structure along the vertical plane B-B' of FIG. 10A.
Figure 10C:
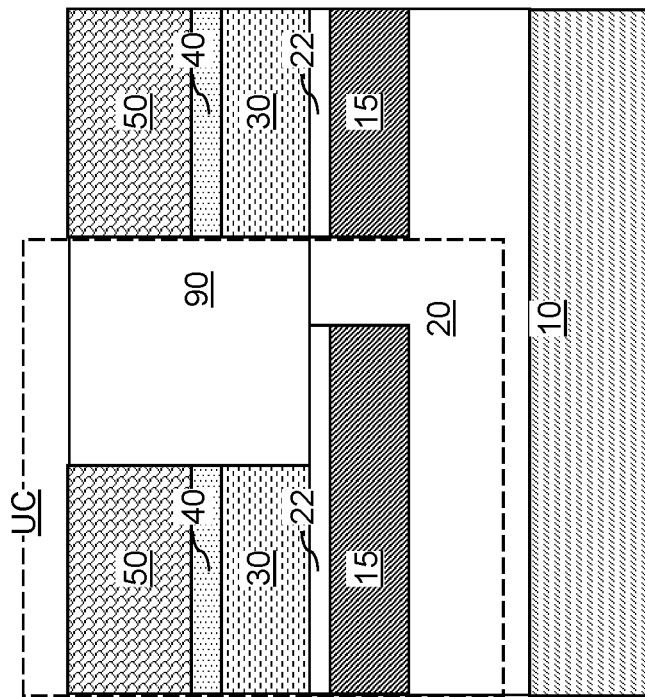
FIG. 10C is a vertical cross-sectional of the first exemplary structure along the vertical plane C-C' of FIG. 10A.
Figure 10D:
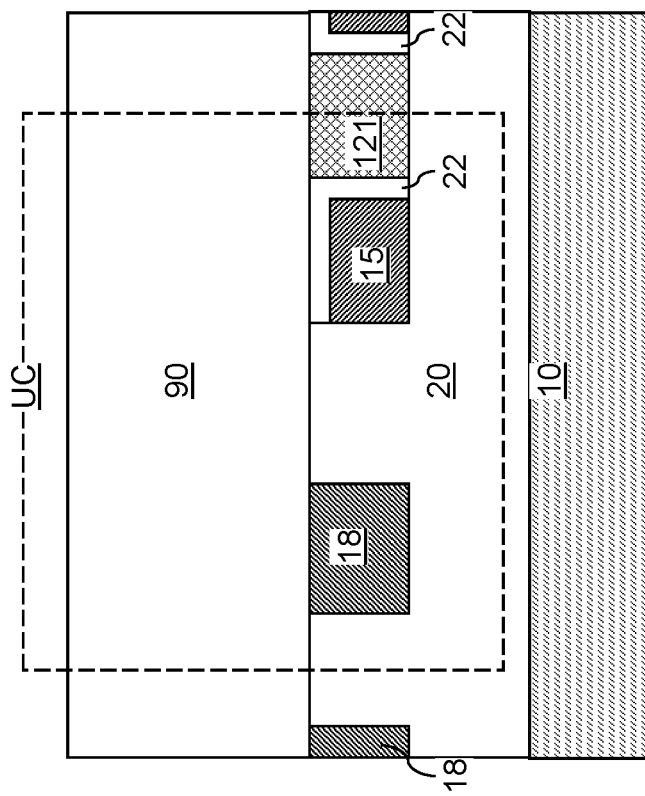
FIG. 10D is a vertical cross-sectional of the first exemplary structure along the vertical plane D-D' of FIG. 10A.
Figures 11A, 11B:
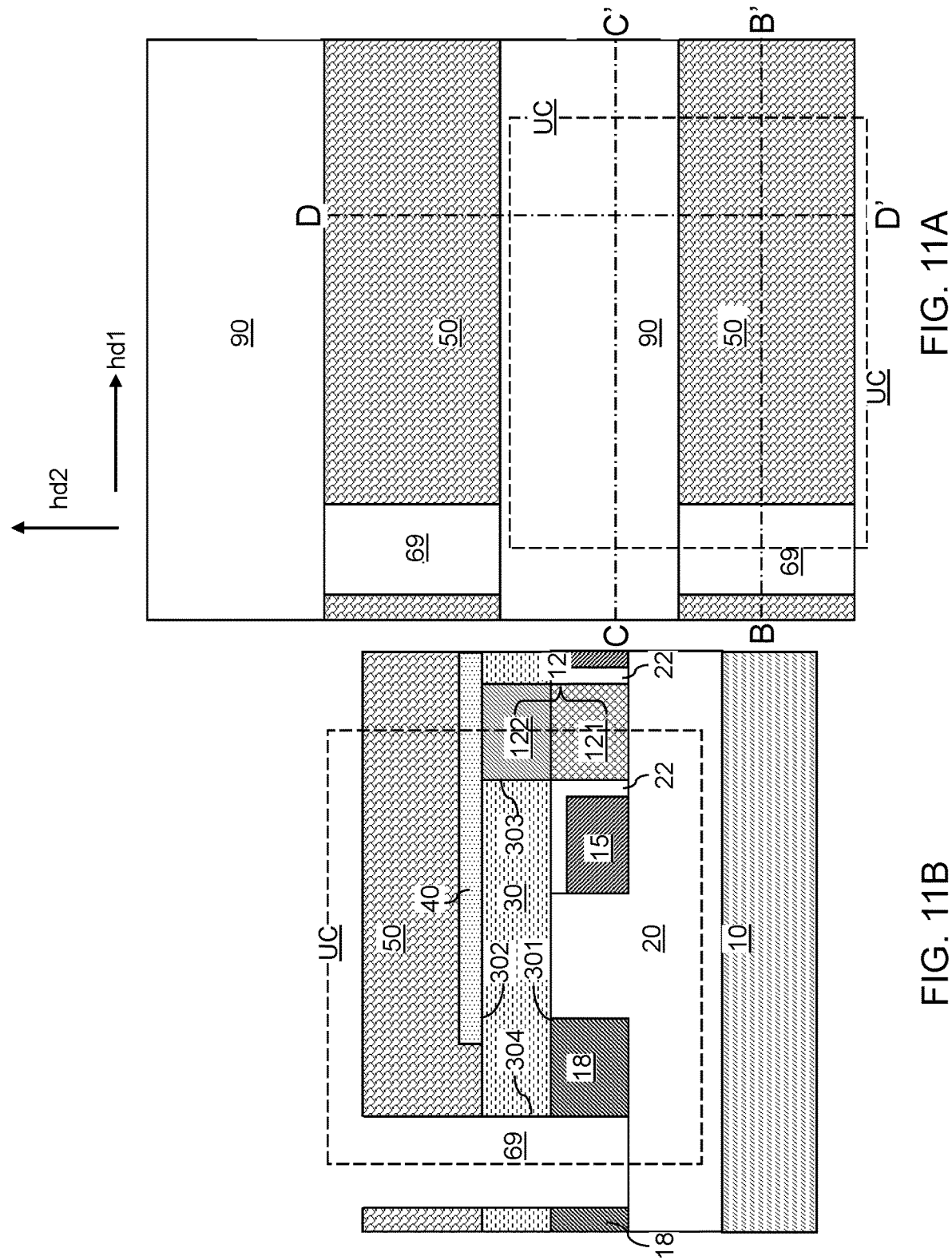
FIG. 11A is a top-down view of the first exemplary structure after formation of gate via cavities according to an embodiment of the present disclosure.
FIG. 11B is a vertical cross-sectional of the first exemplary structure along the vertical plane B-B' of FIG. 11A.
Figure 11D:
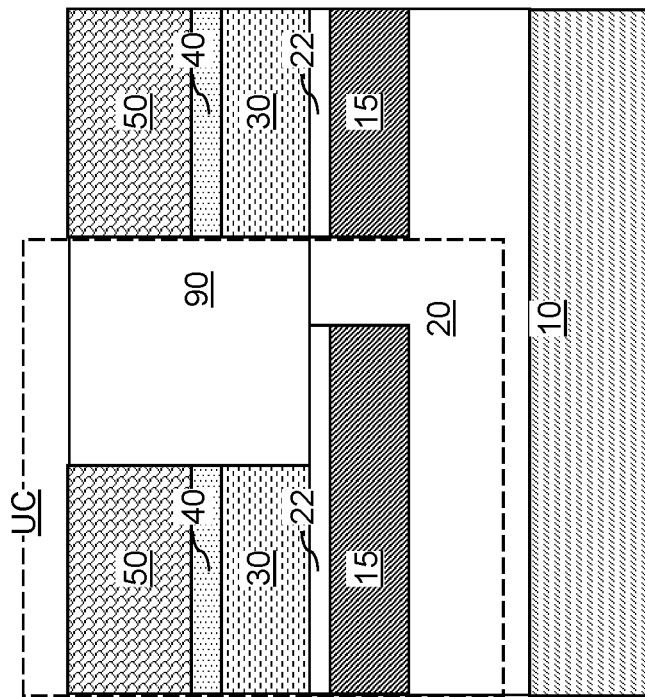
FIG. 11D is a vertical cross-sectional of the first exemplary structure along the vertical plane D-D' of FIG. 11A.
Figure 11C:
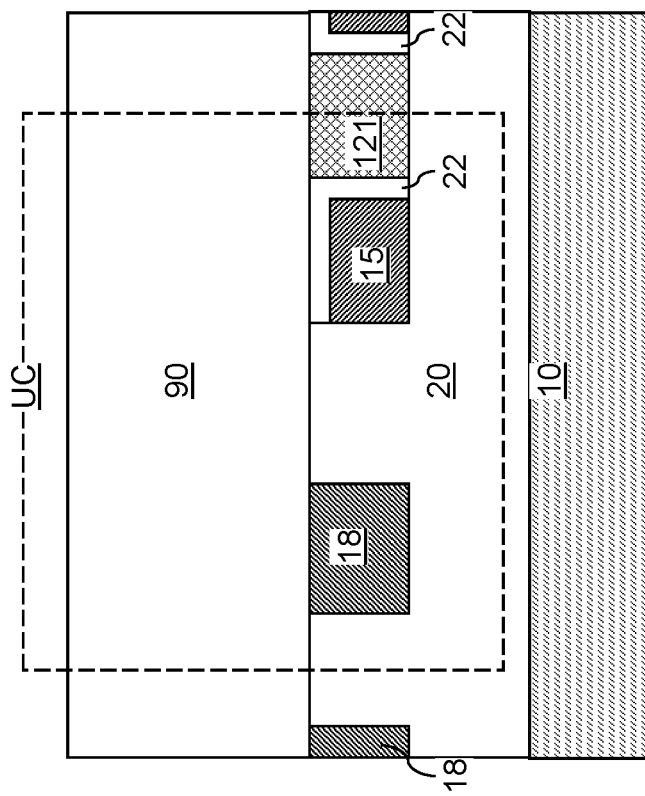
FIG. 11C is a vertical cross-sectional of the first exemplary structure along the vertical plane C-C' of FIG. 11A.
Figures 12A, 12B:
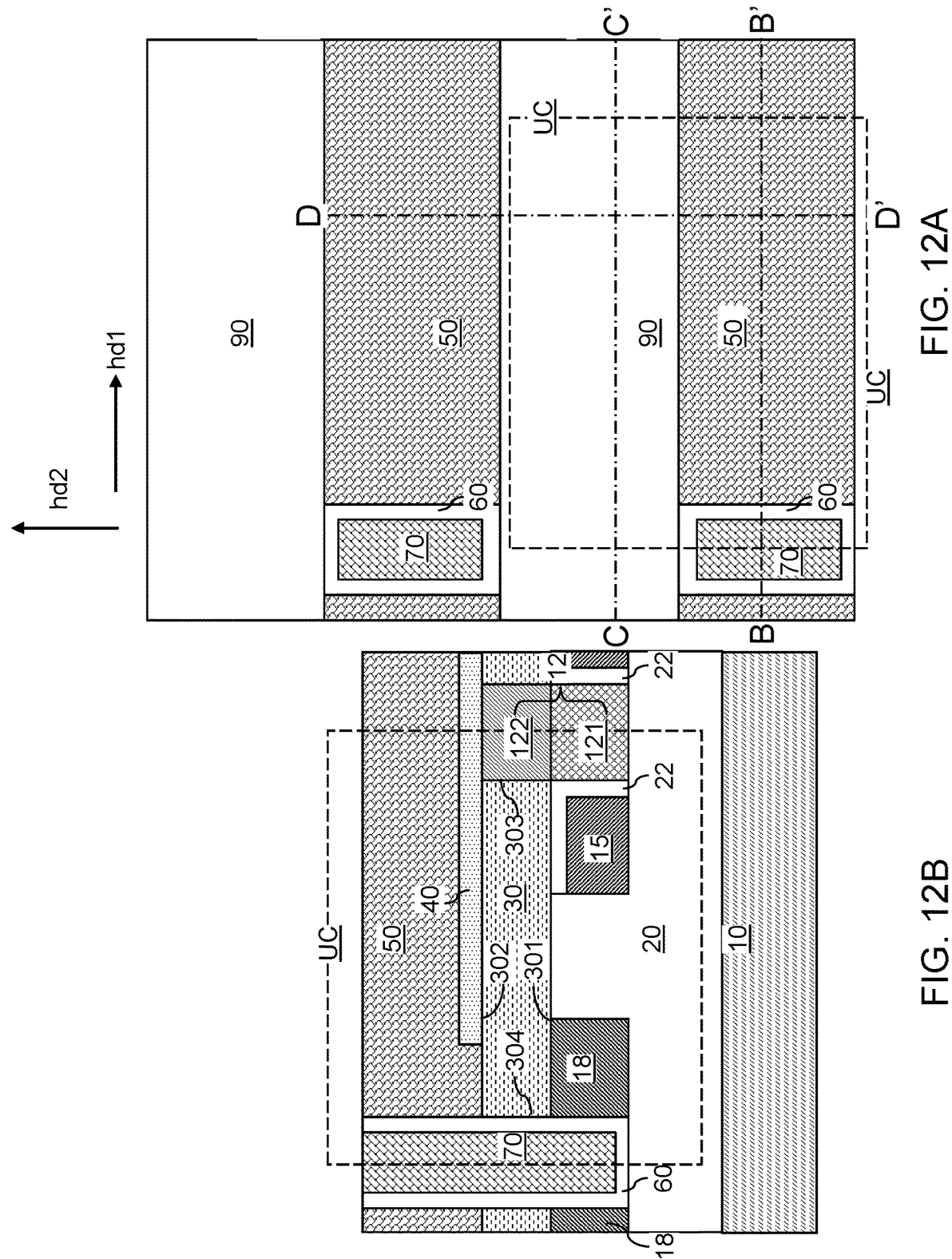
FIG. 12A is a top-down view of the first exemplary structure after formation of a second gate dielectric layer and a second gate electrode in each gate via cavity according to an embodiment of the present disclosure.
FIG. 12B is a vertical cross-sectional of the first exemplary structure along the vertical plane B-B' of FIG. 12A.
Figure 12C:
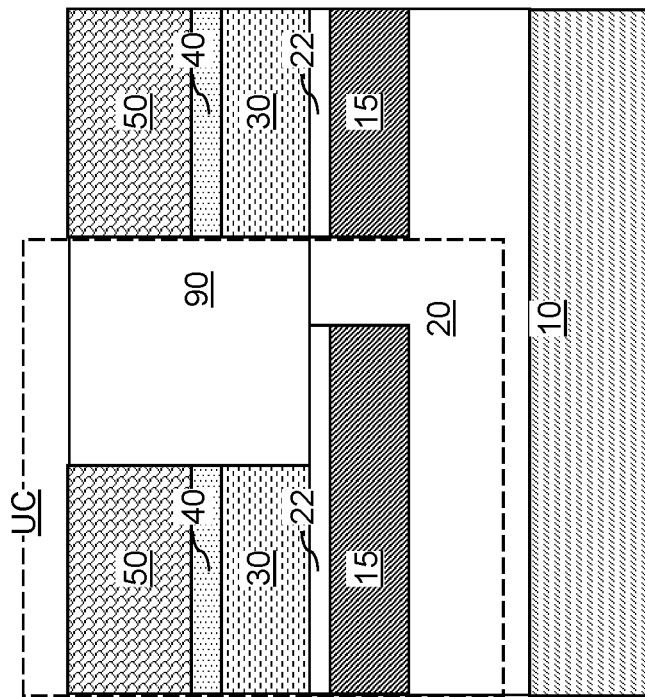
FIG. 12C is a vertical cross-sectional of the first exemplary structure along the vertical plane C-C' of FIG. 12A.
Figure 12D:
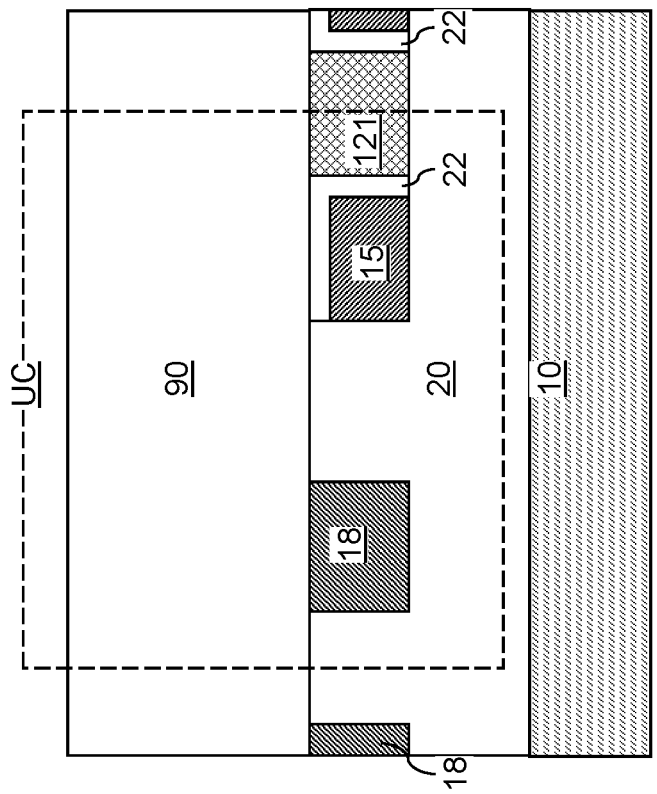
FIG. 12D is a vertical cross-sectional of the first exemplary structure along the vertical plane D-D' of FIG. 12A.
Figure 13A:
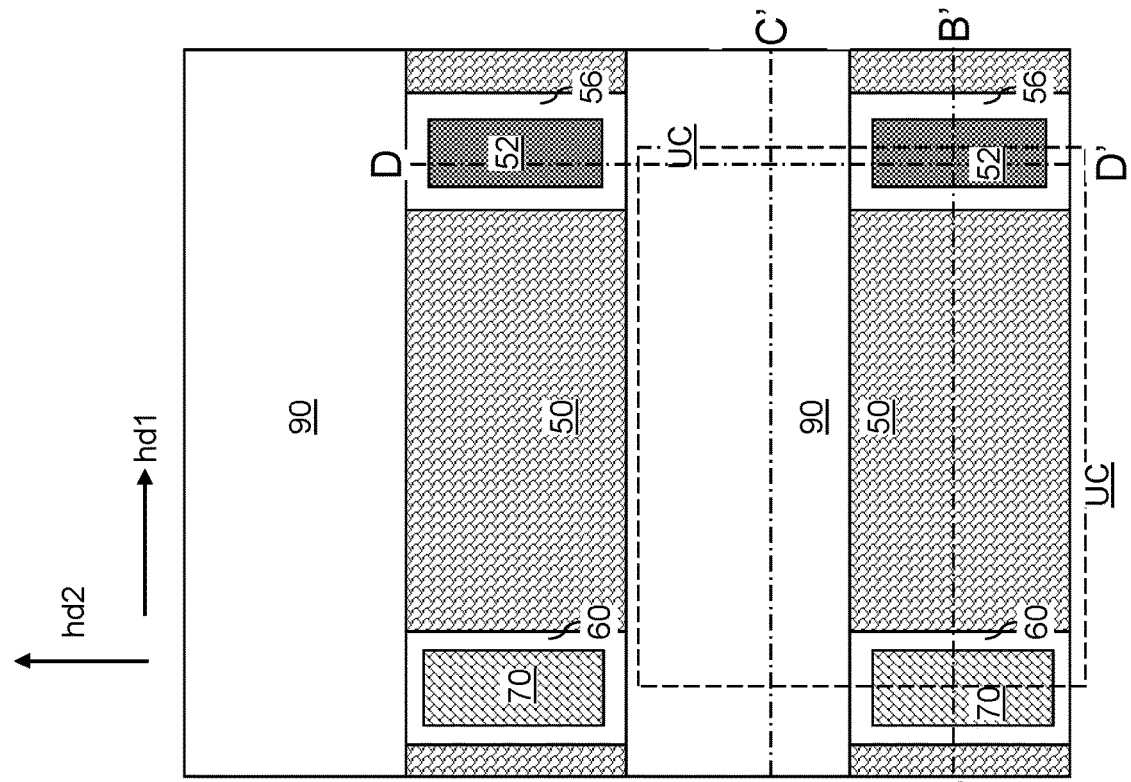
FIG. 13A is a top-down view of the first exemplary structure after formation of laterally-insulated source contact structures according to an embodiment of the present disclosure.
Figure 13B:
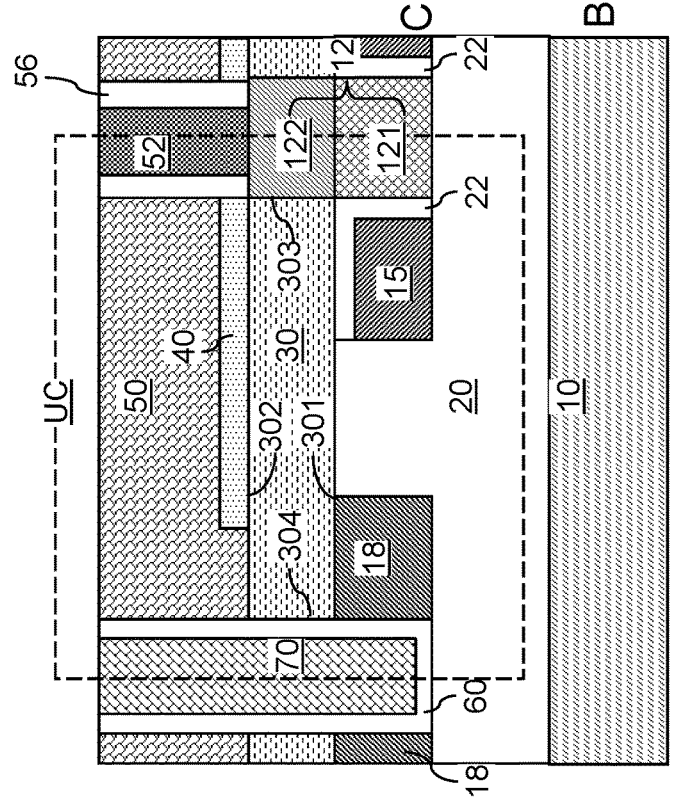
FIG. 13B is a vertical cross-sectional of the first exemplary structure along the vertical plane B-B' of FIG. 13A.
Figure 13D:
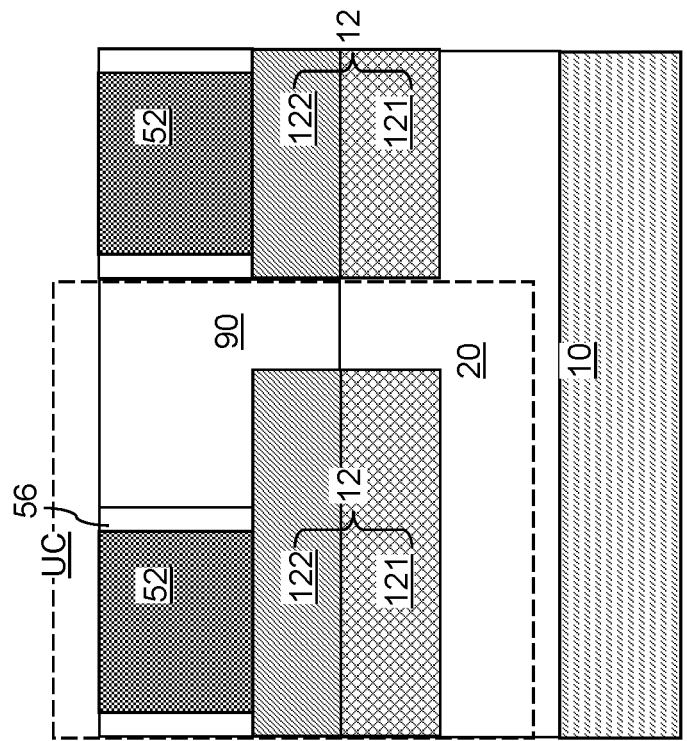
FIG. 13D is a vertical cross-sectional of the first exemplary structure along the vertical plane D-D' of FIG. 13A.
Figure 13C:
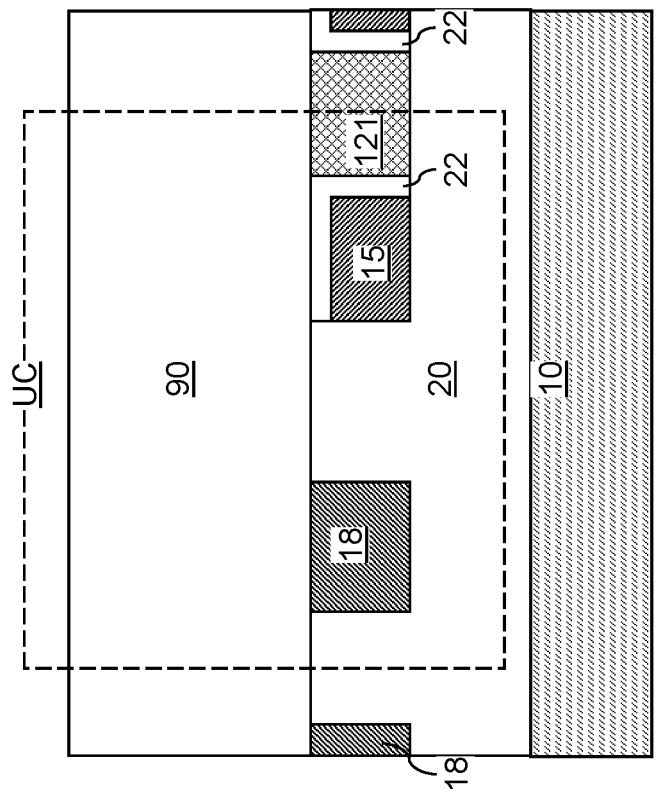
FIG. 13C is a vertical cross-sectional of the first exemplary structure along the vertical plane C-C' of FIG. 13A.
Figure 14A:
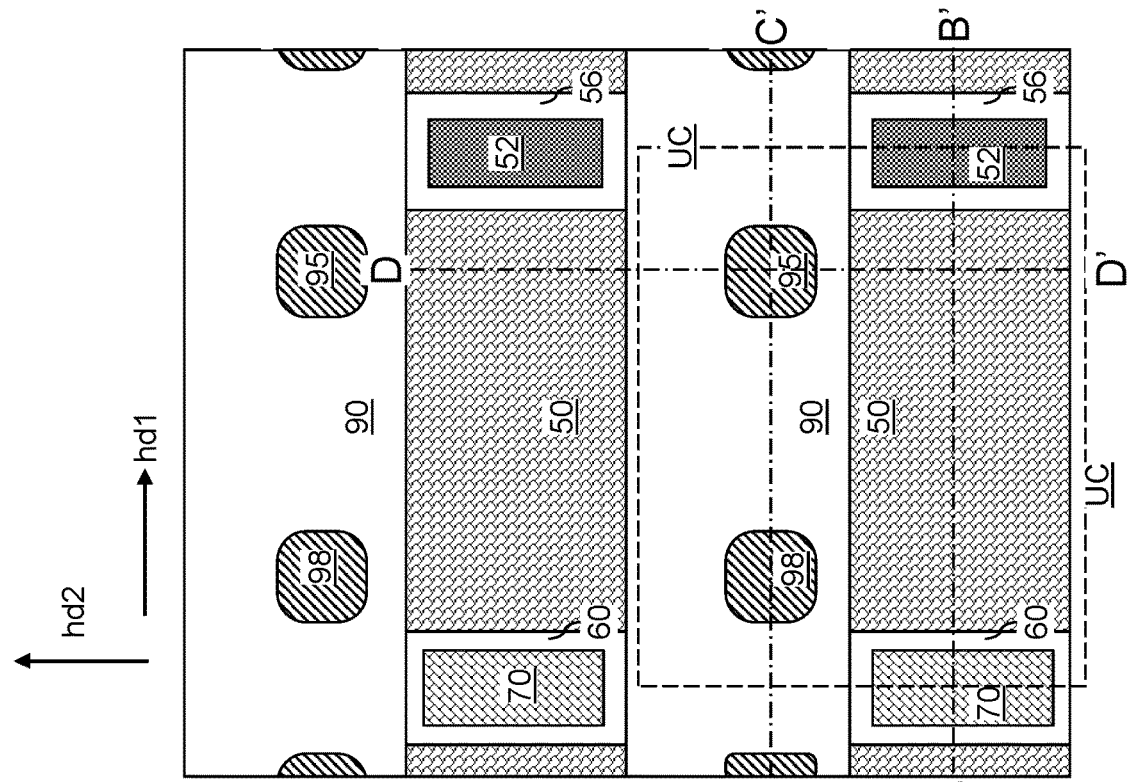
FIG. 14A is a top-down view of the first exemplary structure after formation of gate contact via structures and drain contact via structures according to an embodiment of the present disclosure.
Figure 14B:
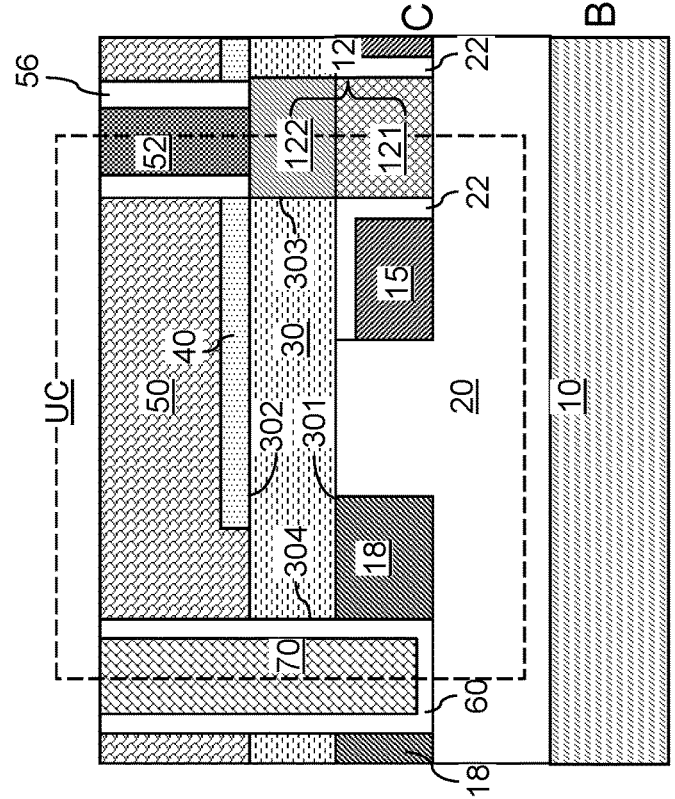
FIG. 14B is a vertical cross-sectional of the first exemplary structure along the vertical plane B-B' of FIG. 14A.
Figure 14D:
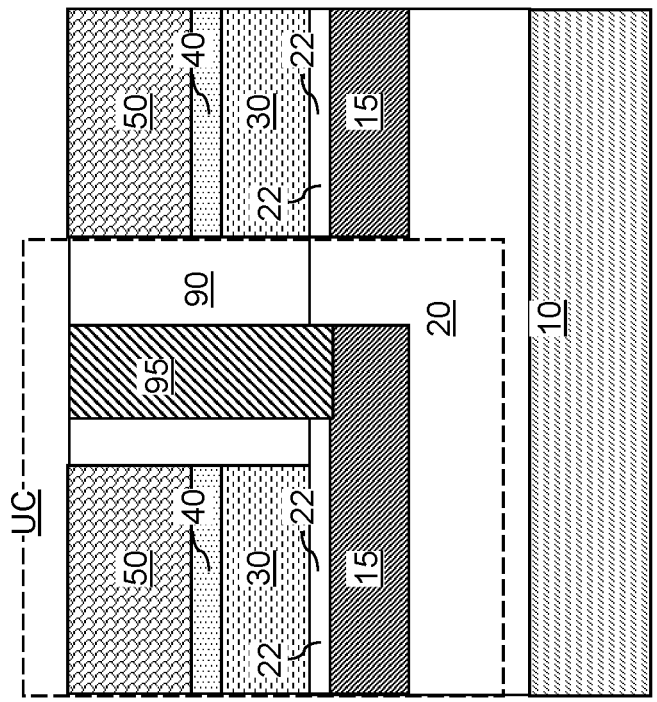
FIG. 14D is a vertical cross-sectional of the first exemplary structure along the vertical plane D-D' of FIG. 14A.
Figure 14C:
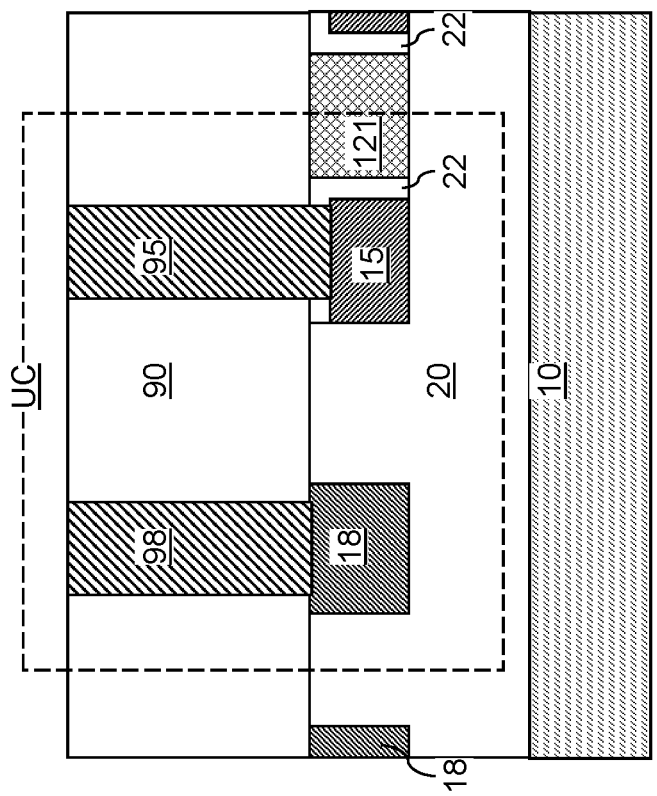
FIG. 14C is a vertical cross-sectional of the first exemplary structure along the vertical plane C-C' of FIG. 14A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed generally to semiconductor devices, and specifically to a semiconductor device using three gate electrodes and dual semiconductor channels and methods of manufacturing the same. According to an embodiment of the present disclosure, a metal oxide semiconductor channel layer is used to provide both a horizontal electrical current path and a vertical electrical current path. The horizontal electrical path may be between a source region and a drain region. The horizontal electrical path may be controlled by a first gate electrode which is a floating gate electrode that may store electrical charges. Further, the horizontal electrical path may be selected in an array setting by a backside gate electrode. The backside gate electrode may turn on the horizontal electrical path or turn off the horizontal electrical path. The drain region may be embedded in an insulating matrix layer. The drain region may contact an end portion of a first major surface of a metal oxide semiconductor channel layer. The source region may contact a first end surface of the metal oxide semiconductor channel layer that may be perpendicular to the first major surface. Charging or discharging the electrical charges in the first gate electrode may be effected by a combination of a second gate dielectric layer and a second gate electrode that may be provided on a sidewall of the metal oxide semiconductor channel layer. The memory device of various embodiments of the present disclosure includes a dual channel transistor device using three gate electrodes, which include the backside gate electrode, the first gate electrode that overlies a second major surface of the metal oxide semiconductor channel layer, and a second gate electrode that is laterally spaced from a second end surface of the metal oxide semiconductor channel layer by a second gate dielectric layer. The dual channel transistor device may store electrical charges in the first gate electrode without charge tunneling. The first channel direction may be orthogonal to a second channel direction. Thus, the memory device of the various embodiment of the present disclosure is also referred to as an orthogonal channel transistor device.

Referring to FIGS. 1A-1D, a first exemplary structure according to an embodiment of the present disclosure is illustrated. The first exemplary structure includes a substrate 10, which may be a semiconductor substrate (such as a semiconductor wafer), an insulating substrate, a conductive substrate, or a hybrid substrate including multiple material layers. An insulating matrix layer 20 may be formed on a top surface of the substrate 10, or may be provided as a top portion of the substrate 10. Alternatively, in embodiments in which the substrate 10 comprises an insulating substrate, the insulating matrix layer 20 may be an upper portion of the insulating substrate. In an illustrative example, the insulating matrix layer 20 may be deposited using a conformal or non-conformal deposition method. For example, the insulating matrix layer 20 may include a silicon oxide material (such as undoped silicate glass or a doped silicate glass). The insulating matrix layer 20 may have a thickness in a range from 100 nm to 2,000 nm, although lesser and greater thicknesses may also be used. Alternative materials that may be used for the insulating matrix layer 20 include, but are not limited to, quartz, silicon carbide nitride, and aluminum oxide. Other suitable materials are within the contemplated scope of disclosure. In embodiments in which the substrate 10 includes a semiconductor substrate (such as a silicon substrate), semiconductor devices (not shown) such as field effect transistors may be formed on the substrate 10. In such embodiments, the insulating matrix layer 20 may have metal interconnect structures (not shown) formed therein.

A photoresist layer (not shown) may be applied over the top surface of the insulating matrix layer 20. The photoresist layer may be lithographically patterned to form discrete openings therethrough. At least one pair of openings may be patterned in the photoresist layer. In one embodiment, the openings in the photoresist layer may be arranged in a pattern of a two-dimensional periodic array that may be repeated along a first horizontal direction hd1 with a first pitch and along a second horizontal direction hd2 with a second pitch. In an illustrative example, the first pitch may be in a range from 80 nm to 2,000 nm, such as from 200 nm to 1,000 nm, although lesser and greater first pitches may also be used. The second pitch may be in a range from 40 nm to 1,000 nm, such as from 80 nm to 500 nm, although lesser and greater second pitches may also be used.

In one embodiment, the pattern of the two-dimensional periodic array may be a rectangular periodic pattern having the area of a rectangular unit cell UC. The rectangular periodic pattern may be repeated along the first horizontal direction hd1 with the first pitch and may be repeated along the second horizontal direction hd2 with the second pitch. In an alternative embodiment, the pattern of a unit cell may be flipped into a mirror image at each boundary of unit cells UC along the first horizontal direction hd1, and/or at each boundary of unit cells UC along the second horizontal direction hd2. While the present disclosure is described using an embodiment in which the pattern of a unit cell UC is flipped into a mirror image at each boundary of the unit cells UC along the first horizontal direction hd1, and is not flipped at boundaries of the unit cells UC along the second horizontal direction hd2, embodiments are expressly contemplated herein in which the pattern of unit cells UC is flipped or not flipped along each, and/or either of the first horizontal direction hd1 and the second horizontal direction hd2.

In one embodiment, the area of a unit cell UC may include two openings in the photoresist layer that are laterally spaced apart along the first horizontal direction hd1. In one embodiment, each opening in the photoresist layer may have a rectangular shape. Other shapes for the openings are within the contemplated scope of disclosure. An anisotropic etch process may be performed to transfer the pattern in the photoresist layer through an upper portion of the insulating matrix layer 20. Recess regions (17, 14) may be formed in volumes of the insulating matrix layer 20 that are removed by the anisotropic etch process. Alternatively, an isotropic etch process may be used to pattern the recess regions (17, 14) in the insulating matrix layer 20. The photoresist layer may be subsequently removed, for example, by ashing.

The recess regions (17, 14) may include drain recess regions 17 in which drain regions are subsequently formed. The recess regions (17, 14) may also include gate recess regions 14 in which backside gate electrodes are subsequently formed. A pair of a drain recess region 17 and a gate recess region 14 may be laterally spaced apart along the first horizontal direction hd1. A plurality of pairs of a drain recess region 17 and a gate recess region 14 may be formed, and may be arranged in rows, each row extending along the second horizontal direction hd2.

Each of the recess regions (17, 14) may have a depth in a range from 10 nm to 200 nm, although lesser and greater depths may also be used. A pair of a drain recess region 17 and a gate recess region 14 that are laterally spaced apart from each other along the first horizontal direction hd1 may have edges that are parallel to the second horizontal direction hd2. In such an embodiment, the pair of drain recess region 17 and the gate recess region 14 may have a uniform lateral separation distance. The lateral spacing between a pair of a drain recess region 17 and a gate recess region 14 may be in a range from 20 nm to 600 nm, such as from 40 nm to 300 nm, although lesser and greater lateral spacings (which are channel lengths) may also be used. In one embodiment, the recess regions (17, 14) may have a rectangular horizontal cross-sectional shape, although other cross-sectional shapes are within the contemplated scope of disclosure. The lateral dimension of each recess region (17, 14) along the first horizontal direction hd1 may be in a range from 20 nm to 600 nm, although lesser and greater dimensions may also be used. The lateral dimension of each recess region (17, 14) along the second horizontal direction hd2 may be in a range from 20 nm to 600 nm, although lesser and greater dimensions may also be used.

Referring to FIGS. 2A-2D, at least one conductive material may be deposited in the recess regions (17, 14) by a conformal or non-conformal deposition process. The at least one conductive material may include a doped semiconductor material and/or a metallic material. Exemplary metallic materials that may be used as the conductive material include conductive metallic nitride materials such as TiN, TaN, and/or WN, elemental metals such as W, Ru, Co, Mo, Ti, Ta, intermetallic alloys of at least two elemental metals, and metal-semiconductor alloy material such as metal silicides. Other suitable metallic materials may be within the contemplated scope of disclosure. Exemplary doped semiconductor materials that may be used as the at least one conductive material include, but are not limited to, doped polysilicon, a doped silicon-germanium alloy, a doped III-V compound semiconductor material such as GaAs, InAs, or InGaAs, and a heavily doped metal oxide semiconductor material such as indium gallium zinc oxide (IGZO), doped zinc oxide, doped indium oxide, or doped cadmium oxide with a high level of doping. Other suitable semiconductor materials may be within the contemplated scope of disclosure. The dopant concentration in the doped semiconductor materials may be in a range from $1.0\times10^{19}/cm^3$ to $2.0\times10^{21}/cm^3$, although lesser and greater dopant concentrations may also be used. The dopant may be p-type or n-type.

Excess portions of the at least one conductive material may be removed from above a horizontal plane including the top surface of the insulating matrix layer 20 by a planarization process such as a chemical mechanical planarization (CMP) process. Each remaining portion of the at least one conductive material filling a drain recess region 17 comprises a drain region 18. Each remaining portion of the at least one conductive material filling a gate recess region 14 comprises a backside gate electrode 15. In one embodiment, top surfaces of the drain regions 18 and the top surfaces of the backside gate electrodes 15 may be coplanar with the top surface of the insulating matrix layer 20.

Referring to FIGS. 3A-3D, a photoresist layer (not shown) may be applied over the top surface of the insulating matrix layer 20, drain regions 18 and backside gate electrodes 15. The photoresist layer (not shown) may be lithographically patterned to form discrete openings therethrough. One opening may be patterned within each area of a unit cell UC in the photoresist layer. Each opening in the photoresist layer may have an edge that overlaps with an edge of, or straddles an edge portion of, a respective backside gate electrode 15. In one embodiment, each opening in the photoresist layer may have a rectangular shape. Other shape openings are within the contemplated scope of disclosure. An anisotropic etch process may be performed to transfer the pattern in the photoresist layer through an upper portion of the insulating matrix layer 20. Source recess regions 11 may be formed in volumes of the insulating matrix layer 20 that are removed by the anisotropic etch process. Alternatively, an isotropic etch process may be used to pattern the source recess regions 11 in the insulating matrix layer 20. The etch process may remove the material of the insulating matrix layer 20 selective to the material of the backside gate electrodes 15. The photoresist layer may be subsequently removed, for example, by ashing.

A source recess region 11 may be formed within each unit cells UC such that a sidewall of a backside gate electrode 15 is physically exposed to the source recess region 11. Each source recess region 11 may have a depth in a range from 10 nm to 200 nm, although lesser and greater depths may also be used. In one embodiment, the source recess regions 11 may have a rectangular horizontal cross-sectional shape, although other cross-sectional shapes are within the contemplated scope of disclosure. The lateral dimension of each source recess region 11 along the first horizontal direction hd1 may be in a range from 20 nm to 600 nm, although lesser and greater dimensions may also be used. The lateral dimension of each source recess region along the second horizontal direction hd2 may be in a range from 30 nm to 600 nm, although lesser and greater dimensions may also be used.

Referring to FIGS. 4A-4D, a photoresist layer 117 may be applied over the insulating matrix layer 20. The photoresist layer 117 may be lithographically patterned to cover the drain region 18 of a UC while not covering the backside gate electrodes 15 of the UC. An isotropic etch process may be performed to isotropically recess the at least one conductive material of the backside gate electrodes 15 selective to the dielectric material of the insulating matrix layer 20. In one embodiment, the isotropic etch process may be a slow wet etch process that isotropically recesses physically exposed surfaces of the backside gate electrodes 15 by a recess distance. In one embodiment, the recess distance may be the same as, or may be substantially the same as, the thickness of a backside gate dielectric layer to be subsequently formed. For example, the recess distance may be in a range from 1 nm to 12 nm, such as from 2 nm to 6 nm, although lesser and greater recess distances may also be used. The photoresist layer 117 may be subsequently removed, for example, by ashing.

Generally, a portion of the at least one conductive material in the gate recess region 14 may be pattered by isotropically recessing the physically exposed surfaces of the backside gate electrodes 15. The insulating matrix layer 20 may embed the drain regions 18 and the backside gate electrodes 15. The drain regions 18 and the backside gate electrodes 15 may comprise, and/or may consist essentially of, a same set of at least one conductive material. In one embodiment, the drain regions 18 and the backside gate electrodes 15 may comprise, and/or may consist essentially of, a same conductive material. A distal surface (such as the bottom surface) of each drain region 18 and a distal surface (such as the bottom surface) of each backside gate electrode 15 may be parallel to the horizontal plane including the top surface of the insulating matrix layer 20. The distal surface of each drain region 18 and a distal surface of each backside gate electrode 15 may be vertically spaced from the horizontal plane including the top surface of the insulating matrix layer 20 by a same spacing.

Referring to FIGS. 5A-5D, backside gate dielectric layers 22 may be formed on the physically exposed surfaces of the backside gate electrodes 15. In one embodiment, the backside gate electrodes 15 include a heavily doped semiconductor material (such as heavily doped polysilicon) that may form a dielectric oxide material (such as silicon oxide). In this embodiment, the top surfaces of the drain regions 18 may be masked with a sacrificial oxidation barrier layer (not shown) such as a thin silicon nitride layer having a thickness in a range from 5 nm to 20 nm. An oxidation process may be performed to convert physically exposed surface portions of the backside gate electrodes 15 into the backside gate dielectric layers 22. The sacrificial oxidation barrier layer may be removed, for example, by ashing.

Alternatively, the backside gate dielectric layers 22 may be formed by conformal deposition of a backside gate dielectric material layer, and by patterning the backside gate dielectric material layer such that remaining portions of the backside gate dielectric material layer comprise the backside gate dielectric layers 22. In this embodiment, the backside gate dielectric layers 22 may be deposited by a conformal deposition process such as a low pressure chemical vapor deposition (LPCVD) process or an atomic layer deposition (ALD) process, and may be patterned using a masked etch process. In this embodiment, a patterned photoresist layer may be used as an etch mask during the masked etch process. The backside gate dielectric layers 22 may cover the top surface and a sidewall of each backside gate electrode 15.

The backside gate dielectric material of the backside gate dielectric layers 22 may include a gate dielectric material such as silicon oxide, silicon oxynitride, a dielectric metal oxide, or a combination thereof. Other suitable dielectric materials are within the contemplated scope of disclosure. The thickness of the backside gate dielectric layers 22 may be in a range from 1 nm to 12 nm, such as from 2 nm to 6 nm, although lesser and greater thicknesses may also be used.

Generally, each backside gate dielectric layer 22 may be formed on a respective backside gate electrode 15. Each backside gate dielectric layer 22 may be formed by depositing a backside gate dielectric material on a backside gate electrode 15. Alternatively, each backside gate dielectric layer 22 may be formed by converting a surface portion of a backside gate electrode 15 into a dielectric material, for example, by oxidation. The insulating matrix layer 20 may be disposed between the drain region 18 and the backside gate electrode 15 within each unit cell UC. In one embodiment, backside gate dielectric layer 22 may comprises, and/or may consist of, a first portion that extends parallel to the first horizontal direction hd1 and a second portion that extends perpendicular to the first horizontal direction hd1.

Referring to FIGS. 6A-6D, at least one conductive material may be deposited in the source recess regions 11 by a conformal or non-conformal deposition process. The at least one conductive material may include a doped semiconductor material and/or a metallic material. Any conductive material that may be used to form the drain regions 18 and the backside gate electrodes 15 may be used as the at least one conductive material deposited in the source recess regions 11. The material deposited in the source recess regions 11 may be the same as, or may be different from, the at least one conductive material of the drain regions 18 and the backside gate electrodes 15.

Excess portions of the at least one conductive material may be removed from above a horizontal plane including the top surface of the insulating matrix layer 20 by a planarization process. In one embodiment, the planarization process may use a recess etch process that etches the at least one conductive material selective to the materials of the backside gate dielectric layers 22 and the insulating matrix layer 20. Optionally, a chemical mechanical planarization process may be performed prior to the recess etch process to thin the at least one conductive material from above the backside gate dielectric layers 22 and the insulating matrix layer 20 without physically exposing the backside gate dielectric layer 22 to prevent mechanical damages.

Each remaining portion of the at least one conductive material filling a source recess region 11 comprises a first source portion 121, which is a first portion of a source region. Each first source portion 121 may be formed in the insulating matrix layer 20. Each first source portion 121 may be adjacent to a backside gate dielectric layer 22. Each first source portion 121 may contact a sidewall of the backside gate dielectric layer 22. In one embodiment, top surfaces of the drain regions 18 and the backside gate dielectric layers 22 may be coplanar with the top surface of the insulating matrix layer 20. Top surfaces of the first source portions 121 may be coplanar with, or may be recessed below, the horizontal plane including the top surface of the insulating matrix layer 20.

A metal oxide semiconductor channel layer 30 may be deposited over the first source portion 121, the backside gate dielectric layers 22, the drain regions 18, and the insulating matrix layer 20. The metal oxide semiconductor channel layer 30 includes a metal oxide semiconductor material such as indium gallium zinc oxide (IGZO), doped zinc oxide, doped indium oxide, or doped cadmium oxide. Other suitable metal oxide semiconductor materials are within the contemplated scope of disclosure. The dopant level in the metal oxide semiconductor channel layer 30 may be selected such that leakage current through the metal oxide semiconductor channel layer 30 during device operation is negligible. For example, the dopant level in the metal oxide semiconductor channel layer 30 may be in a range from $1.0\times10^{10}/cm^3$ to $2.0\times10^{16}/cm^3$, although lesser and greater dopant concentrations may also be used.

The metal oxide semiconductor channel layer 30 may be deposited, for example, by chemical vapor deposition. The metal oxide semiconductor channel layer 30 may have a uniform thickness throughout. The thickness of the metal oxide semiconductor channel layer 30 may be in a range from 10 nm to 200 nm, such as from 20 nm to 100 nm, although lesser and greater thicknesses may also be used. In one embodiment, the metal oxide semiconductor channel layer 30 may have a first major surface 301 that may contact the insulating matrix layer 20, the drain regions 18, the backside gate dielectric layers 22, and the first source portions 121. The metal oxide semiconductor channel layer 30 may have a second major surface 302 that is a top surface. A major surface of an element is a surface that includes at least ⅙ of the entire surface area of the element. In an illustrative example, a cube may have six major surfaces, and an object having a shape of a rectangular parallelepiped with unequal sides may have two major surfaces or four major surfaces depending on the ratios between the lengths of the sides. In one embodiment, the first major surface and the second major surface may be planar surfaces, i.e., surfaces located within a respective two-dimensional plane.

Use of a metal oxide semiconductor material instead of an elemental semiconductor material or a III-V compound semiconductor material in the metal oxide semiconductor channel layer 30 provides the advantage of suppressing leakage current to negligible levels. The use of a metal oxide semiconductor material instead of an elemental semiconductor material or a III-V compound semiconductor material as a channel material may enable a non-volatile memory device. Metal oxide semiconductor materials may provide an on-off ratio greater than $1.0\times10^9$. In other words, the ratio of the on-current to off-current may be greater than $1.0\times10^9$ for a field effect transistor using a metal oxide semiconductor material as a channel material. In contrast, channels composed of elemental semiconductor materials and III-V compound semiconductor materials provide an on-off ratio of about $1.0\times10^4$. Thus, use of a metal oxide semiconductor material as a channel material provides the benefit of low leakage current. The low leakage current property may provide a non-volatile memory device. If the charge retention time is greater than 1 day or 365 days, the memory device of the present disclosure may function as a non-volatile memory device. Optionally, the memory device to be subsequently formed may be operated with periodic refreshing in the same manner as dynamic random access memories. For example, if the charge retention time is less than 1 day, the memory device of the present disclosure may be operated with a periodic memory refresh operation, in which a data bit is read and re-written on a periodic basis that is within the retention time.

Referring to FIGS. 7A-7D, second source portion 122 may be formed through the metal oxide semiconductor channel layer 30 directly on the top surface of a respective one of the first source portions 121. In one embodiment, a masked ion implantation may be performed to convert discrete portions of the metal oxide semiconductor channel layer 30 into the second source portions 122. In this embodiment, a photoresist layer (not shown) may be applied over the metal oxide semiconductor channel layer 30. The photoresist layer may be lithographically patterned to form an array of opening in areas that overlie the array of first source portions 121. Electrical dopants (such as p-type dopants or n-type dopants) may be implanted through the openings in the photoresist layer to convert the implanted portions of the metal oxide semiconductor channel layer 30 into the second source portions 122. The electrical dopants may be selected from, but are not limited to, Na, K, Mg, Ca, Sr, Sc, Y, La, B, Al, Ga, N, P. As, Sb, F, Cl, and Br. The atomic concentration of the electrical dopants in the second source portions 122 may be in a range from $1.0 \times 10^{19}/cm^3$ to $2.0 \times 10^{21}/cm^3$, such as from $5.0 \times 10^{19}/cm^3$ to $1.0 \times 10^{21}/cm^3$, although lesser and greater atomic concentrations may also be used. In this embodiment, each second source portion 122 may include a same metal oxide semiconductor material as the metal oxide semiconductor channel layer 30, However, the second source portion 122 may also include at least one dopant atom at a higher atomic concentration than in the metal oxide semiconductor channel layer 30. The photoresist layer may be subsequently removed.

Alternatively, an anisotropic etch process may be performed in lieu of the ion implantation process. Portions of the metal oxide semiconductor channel layer 30 underlying the openings in the photoresist layer may be removed to form recess cavities. In such an embodiment, a top surface of each first source portion 121 may be physically exposed at the bottom of each recess cavity formed in the metal oxide semiconductor channel layer 30 underlying the openings in the photoresist layer. The photoresist layer may be removed, for example, by ashing. At least one conductive material may be deposited in the recess cavities. The at least one conductive material that is deposited in the recess cavities may be any conductive material that may be used for the drain regions 18, the backside gate electrodes 15, and/or the first source portions 121. Excess portions of the at least one conductive material may be removed from above the horizontal plane including the top surface of the metal oxide semiconductor channel layer 30 by a planarization process. The planarization process may use a recess etch process or a chemical mechanical planarization process. Each remaining portion of the at least one conductive material that fills a respective recess cavity comprises a second source portion 122. In this embodiment, the second source portions 122 may include the same material as, or may include different materials from, the material of the drain regions 18 and the backside gate electrodes 15. The second source portions 122 may include the same material as, or may include different materials from, the material of the first source portions 121. The second source portions 122 may include the same material as, or may include different materials from, the material of the metal oxide semiconductor channel layer 30. In one embodiment, the second source portions 122 may include, and/or may consist essentially of, at least one metallic material. Each vertical stack of a first source portion 121 and a second source portion 122 comprises a source region 12.

Generally, a source region 12 may include a first portion comprising a first source portion 121 and a second portion comprising a second source portion 122. The second portion of each source region 12 may be formed by doping a portion of the metal oxide semiconductor channel layer 30, or by replacing a portion of the metal oxide semiconductor channel layer 30 with a conductive material portion. The second portion of the source region 12, comprising a second source portion 122, contacts the first portion of the source region 12 comprising a first source portion 121. Generally, each source region 12 may be formed such that the source region 12 contacts an end surface (e.g., 303) of the metal oxide semiconductor channel layer 30 that is perpendicular to, and is adjoined to, the major surfaces (301, 302) of the metal oxide semiconductor channel layer 30.

In one embodiment, each source region 12 may comprise a first source portion 121 in contact with a backside gate dielectric layer 22. Each source region 12 may further comprise a second source portion 122 in contact with a first end surface 303 of the metal oxide semiconductor channel layer 30. An end surface is a non-major surface that is attached to a major surface. In one embodiment, an interface between the first source portion 121 and the second source portion 122 may be located within a horizontal plane including an interface between the metal oxide semiconductor channel layer 30 and the insulating matrix layer 20. Alternatively, an interface between the first source portion 121 and the second source portion 122 may be recessed below a top surface of the insulating matrix layer 20. In one embodiment, the first source portions 121 and the second source portions 122 may comprise different conductive materials.

Referring to FIGS. 8A-8D, a first gate dielectric material layer may be deposited on the second major surface 302 (i.e., the planar top surface) of the metal oxide semiconductor channel layer 30. The first gate dielectric material layer includes a gate dielectric material such as silicon oxide, silicon oxynitride, a dielectric metal oxide, or a combination thereof. Other suitable dielectric materials are within the contemplated scope of disclosure. The thickness of the first gate dielectric material layer may be in a range from 1 nm to 12 nm, such as from 2 nm to 6 nm, although lesser and greater thicknesses may also be used. The first gate dielectric material layer may be deposited by a conformal deposition process or a non-conformal deposition process.

According to an embodiment of the present disclosure, the first gate dielectric material layer may be patterned. For example, by applying and patterning a photoresist layer (not shown) a mask may be formed over the first gate dielectric material layer. The unmasked portions of the first gate dielectric material layer may be etched to form the first gate dielectric layer 40. Each remaining patterned portion of the first gate dielectric material layer constitutes a first gate dielectric layer 40. The photoresist layer may be subsequently removed, for example, by ashing. In one embodiment, each first gate dielectric layer 40 may be formed as strips having a uniform width and laterally extending along the second horizontal direction hd2. In one embodiment, the uniform width of each first gate dielectric layer 40 along the first horizontal direction hd1 may be less than twice the pitch of the unit cell UC along the first horizontal direction hd1. Each first gate dielectric layer 40 may continuously extend over the entirety of the area of a source region 12, the entirety of the area located between the source region 12 and an adjacent drain region 18, and a proximal portion of the adjacent drain region 18, i.e., a portion that is proximal to the source region 12 within each unit cell UC. A distal portion of the adjacent drain region 18 may not be covered by the first gate dielectric layer 40 within each unit cell UC.

In one embodiment, a straight edge of each first gate dielectric layer 40 that laterally extends along the second horizontal direction hd2 overlies a respective drain region 18. Thus, a proximal portion of each drain region 18 may be covered with a first gate dielectric layer 40, and a distal portion of each drain region 18 may not be covered with a first gate dielectric layer 40. The fraction of the distal portion of each drain region 18 (i.e., the fraction that is not covered by the first gate dielectric layer 40) relative to the total area of the respective drain region 18 may be in a range from 0.2 to 0.8, such as from 0.35 to 0.65, although lesser and greater fractions may also be used. A portion of a top surface of the metal oxide semiconductor channel layer 30 may be physically exposed above each distal portion of the drain regions 18 such that the physically exposed portions of the metal oxide semiconductor channel layer 30 have an areal overlap with a respective underlying drain region 18.

Referring to FIGS. 9A-9D, a gate electrode material may be deposited on the physically exposed surfaces of the metal oxide semiconductor channel layer 30 and the first gate dielectric layer 40 to form a gate electrode material layer 50L. The gate electrode material may include a doped semiconductor material or a metallic material. Doped semiconductor materials that may be used as the gate electrode material include doped polysilicon, a silicon-germanium alloy, or a doped III-V compound semiconductor material. Other suitable doped semiconductor materials are within the contemplated scope of disclosure. The doped semiconductor material as the gate electrode material may include dopants at a dopant concentration in a range from $1.0 \times 10^{19}/cm^3$ to $2.0 \times 10^{21}/cm^3$, although lesser and greater dopant concentrations may also be used. The dopant may be p-type or n-type. Metallic materials that may be used as the gate electrode material include conductive metallic nitride materials (such as TiN, TaN, and WN), elemental metals (such as W, Ta, Ru, Co, or Mo), and intermetallic alloy of at least two metals. Other suitable metallic materials are within the contemplated scope of disclosure. A gate electrode material layer may be formed over the metal oxide semiconductor channel layer 30 and the first gate dielectric layer 40. The thickness of the gate electrode material layer 50L may be in a range from 50 nm to 300 nm, although lesser and greater thicknesses may also be used.

Referring to FIGS. 10A-10D, a photoresist layer (not shown) may be applied over the gate electrode material layer 50L. The photoresist layer may be lithographically patterned to form a line and space pattern that includes photoresist material strips that laterally extend along the first horizontal direction hd1. The line and space pattern may have a uniform pitch along the second horizontal direction hd2, which may be the same as the second pitch. In one embodiment, the gaps between the photoresist material strips may overlie an end portion of each backside gate electrode 15 and an end portion of each drain region 18. Each photoresist material strip may have a uniform width along the second horizontal direction hd2, which may be in a range from 50% to 80% of the second pitch. For example, each photoresist material strip may have a uniform width in a range from 20 nm to 800 nm, such as from 60 nm to 300 nm, although lesser and greater widths may also be used.

An anisotropic etch process may be performed to etch unmasked portions of the gate electrode material layer 50L, the first gate dielectric layer 40, and the metal oxide semiconductor channel layer 30 selective to the materials of the drain regions 18 and the backside gate electrodes 15. Optionally, the anisotropic etch process may be selective to the material of the insulating matrix layer 20. Line trenches laterally extending along the first horizontal direction hd1 may be formed in areas that are not masked by the photoresist material strips. Each of the gate electrode material layer 50L, the first gate dielectric layer 40, and the metal oxide semiconductor channel layer 30 may be divided into multiple strips that laterally extend along the first horizontal direction hd1 and having a second pitch along the second horizontal direction hd2. Specifically, the metal oxide semiconductor channel layer 30 may be divided into a plurality of metal oxide semiconductor channel layer 30 having a respective strip shape. The first gate dielectric layer 40 may be divided into a plurality of first gate dielectric layers 40 having a respective strip shape. The gate electrode material layer 50L may be divided into a plurality of first gate electrodes 50 laterally extending along the first horizontal direction hd1 and having a respective uniform width along the second horizontal direction hd2. Each vertical stack of a metal oxide semiconductor channel layer 30, a first gate dielectric layer 40, and a first gate electrode 50 may have a uniform width, and may be located between a respective neighboring pair of line trenches. The photoresist layer may be subsequently removed, for example, by ashing.

At least one dielectric material may be deposited in the line trenches between each neighboring pair of vertical stacks of a metal oxide semiconductor channel layer 30, a first gate dielectric layer 40, and a first gate electrode 50. For example, the at least one dielectric material may include a silicon nitride liner and a dielectric fill material such as silicon oxide. The thickness of the silicon nitride liner may be in a range from 3 nm to 20 nm, such as from 6 nm to 10 nm, although lesser and greater thicknesses may also be used. The dielectric fill material may be deposited by a conformal deposition process or by spin coating. Excess portions of the at least one dielectric material may be removed from above the horizontal plane including the top surfaces of the first gate electrodes 50 by a planarization process. The planarization process may use a recess etch process and/or a chemical mechanical planarization process. Each remaining portion of the at least one dielectric material that fills a respective line trench comprises a dielectric rail 90.

Referring to FIGS. 11A-11D, a photoresist layer (not shown) may be applied over the dielectric rails 90 and the first gate electrodes 50. The photoresist layer may be lithographically patterned to form an array of discrete openings such that an edge of each opening in the photoresist layer overlies a peripheral portion of a respective drain region 18 that is distal from a respective backside gate electrode 15 in the same UC. In one embodiment, the discrete openings in the photoresist layer may be formed within areas in which the first gate dielectric layers 40 are not present. In one embodiment, each opening in the photoresist layer may laterally extend between a laterally neighboring pair of dielectric rails 90 that are laterally spaced apart along the second horizontal direction hd2.

An anisotropic etch process may be performed to etch through unmasked portions of the first gate electrodes 50, the metal oxide semiconductor channel layers 30, upper portions of the insulating matrix layer 20, and optionally an edge portion of a drain region 18. A gate via cavity 69 may be formed within volumes from which the materials of a first gate electrode 50, a metal oxide semiconductor channel layer 30, and an upper portion of the insulating matrix layer 20 are etched. A sidewall of a first gate electrode 50, a second end surface 304 of a metal oxide semiconductor channel layer 30, and a sidewall of the drain region 18 may be physically exposed on one side of each gate via cavity 69.

In one embodiment, a gate via cavity 69 may have a straight sidewall including a sidewall of a first gate electrode 50, a sidewall of a metal oxide semiconductor channel layer 30, and a sidewall of the drain region 18. The lateral dimension of each gate via cavity 69 along the first horizontal direction hd1 may be in a range from 20 nm to 600 nm, such as from 60 nm to 300 nm, although lesser and greater lateral dimensions may also be used. The lateral dimension of each gate via cavity 69 along the second horizontal direction hd2 may be the same as, or may be greater than, the lateral spacing between a neighboring pair of dielectric rails 90 along the second horizontal direction hd2. Each gate via cavity 69 may have a rectangular horizontal cross-sectional shape, a circular horizontal cross-sectional shape, an oval horizontal cross-sectional shape, or a horizontal cross-sectional shape of any closed non-intersecting two-dimensional horizontal cross-sectional curvilinear shape provided that the gate via cavity 69 laterally extends between a pair of dielectric rails 90.

Generally, a surface of a first gate electrode 50, an end surface (such as the second end surface 304) of a metal oxide semiconductor channel layer 30, and a surface of a drain region 18 may be physically exposed by etching portions of the first gate electrode 50, the metal oxide semiconductor channel layer 30, the insulating matrix layer 20, and an edge portion of the drain region 18.

Referring to FIGS. 12A-12D, a second gate dielectric material layer 60 may be deposited in the gate via cavities 69 and over the first gate electrodes 50 and the dielectric rails 90. The second gate dielectric material layer 60 deposited at this processing step is also referred to as a vertical gate dielectric material layer (which is subsequently used to provide a gate dielectric layer that extends vertically). The second gate dielectric material layer 60 may include any material that may be used for the first gate dielectric layers 40 or for the backside gate dielectric layers 22. For example, the second gate dielectric material layer 60 may include a gate dielectric material such as silicon oxide, silicon oxynitride, a dielectric metal oxide, or a combination thereof. The thickness of the second gate dielectric material layer may be in a range from 1 nm to 12 nm, such as from 2 nm to 6 nm, although lesser and greater thicknesses may also be used. The second gate dielectric material layer 60 may be deposited by a conformal deposition process such as a low pressure chemical vapor deposition (LPCVD) process or an atomic layer deposition (ALD) process. In one embodiment, the second gate dielectric material layer 60 may be deposited on a sidewall of each drain region 18, on a physically exposed end surface of each metal oxide semiconductor channel layer 30, and on a sidewall of each first gate electrode 50. The second gate dielectric material layer 60 does not contact any of the first gate dielectric layers 40.

At least one conductive fill material 70 may be subsequently deposited in the remaining volumes of the gate via cavities 69 over the second gate dielectric material layer 60. The at least one conductive fill material 70 may be any of the materials that may be used as the material of the first gate electrodes 50. For example, the at least one conductive fill material 70 may include a doped semiconductor material or a metallic material. The entire volume of each gate via cavity 69 may be filled with the combination of the second gate dielectric layer 60 and the at least one conductive fill material 70.

Excess portions of the second gate dielectric material layer 60 and the at least one conductive fill material 70 that overlie a horizontal plane including the top surfaces of the first gate electrodes 50 and the dielectric rails 90 may be removed by a planarization process. The planarization process may use a chemical mechanical planarization (CMP) process and/or a recess etch process. The second gate dielectric material layer 60 may be divided into multiple discrete portions, each of which is herein referred to as a second gate dielectric layer 60. In other words, each remaining portion of the second gate dielectric material layer comprises a second gate dielectric layer 60. Each remaining portion of the at least one conductive fill material within a respective gate via cavity constitutes a second gate electrode 70.

Generally, a second gate dielectric layer 60 and a second gate electrode 70 may be formed in each gate via cavity 69. Each second gate dielectric layer 60 may be formed on a sidewall of a drain region 18, on an end surface (such as a sidewall) of a metal oxide semiconductor channel layer 30, and on a sidewall of a first gate electrode 50. Each second gate electrode 70 may be formed on sidewalls of a respective second gate dielectric layer 60, and may be formed within the respective second gate dielectric layer 60. Each second gate electrode 70 may be laterally surrounded by the respective second gate dielectric layer 60, and may contact a top surface of a horizontal bottom portion of the respective second gate dielectric layer 60.

Each second gate dielectric layer 60 may be formed on physically exposed surfaces of the first gate electrode 50, a metal oxide semiconductor channel layer 30, and a drain region 18. Each metal oxide semiconductor channel layer 30 may have a first major surface 301 that contacts the insulating matrix layer 20, a proximal surface of a drain region 18, and a first portion of a backside gate dielectric layer 22. Each metal oxide semiconductor channel layer 30 may also have a second major surface 302 that contacts a first gate dielectric layer 40 and a first gate electrode 50. Each metal oxide semiconductor channel layer 30 may also have a first end surface 303 contacting a surface of a source region 12 (which may be a surface of a second source portion 122 of the source region 12), and a second end surface 304 that contacts a second gate dielectric layer 60. In one embodiment, sidewalls of the gate via cavity 69 may be straight, and the second end surface of the metal oxide semiconductor channel layer 30, a surface (such as a sidewall) of the first gate electrode 50, and the surface (such as a sidewall) of the drain region 18 may be located within a same plane (such as a vertical plane) that is perpendicular to the first major surface 301 and the second major surface 302 of the metal oxide semiconductor channel layer 30.

Referring to FIGS. 13A-13D, a photoresist layer (not shown) may be applied over the dielectric rails 90 and the first gate electrodes 50. The photoresist layer may be lithographically patterned to form an array of discrete openings within areas that overlie a respective one of the source regions 12. In one embodiment, each opening in the photoresist layer may laterally extend between a laterally neighboring pair of dielectric rails 90 that are laterally spaced apart along the second horizontal direction hd2.

An anisotropic etch process may be performed to etch through unmasked portions of the first gate electrodes 50 and the first gate dielectric layers 40. Source contact cavities may be formed within volumes from which the materials of first gate electrodes 50 and the first gate dielectric layers 40 are etched. An array of source contact cavities (not shown) may be formed through the first gate electrodes 50 and the first gate dielectric layers 40. A sidewall of a first gate electrode 50 and a sidewall of a first gate dielectric layer 40 may be physically exposed on each side of a source contact cavity. In one embodiment, a source contact cavity may have a straight sidewall including a sidewall of a first gate electrode 50 and a sidewall of a first gate dielectric layer 40. The lateral dimension of each source contact cavity along the first horizontal direction hd1 may be in a range from 20 nm to 600 nm, such as from 60 nm to 300 nm, although lesser and greater lateral dimensions may also be used. The lateral dimension of each source contact cavity along the second horizontal direction hd2 may be the same as, or may be greater than, the lateral spacing between a neighboring pair of dielectric rails 90 along the second horizontal direction hd2. Each source contact cavity may have a rectangular horizontal cross-sectional shape, a circular horizontal cross-sectional shape, an oval horizontal cross-sectional shape, or a horizontal cross-sectional shape of any closed non-intersecting two-dimensional horizontal cross-sectional curvilinear shape provided that the source contact cavity laterally extends between a pair of dielectric rails 90.

An insulating material layer such as silicon oxide may be conformally deposited in the source contact cavities and over the first gate electrodes 50. Horizontally-extending portions of the insulating material layer may be removed by performing an anisotropic etch process. Each remaining vertically-extending tubular portion of the insulating material layer constitutes a source isolation spacer 56.

At least one conductive material 52 may be deposited in remaining volumes of the source contact cavities. The at least one conductive material may include at least one metallic barrier material such as TiN, TaN, and/or WN and a metallic fill material such as Cu, Co, Ru, Mo, W, another elemental metal, and/or an intermetallic alloy. Other suitable conductive materials are within the contemplated scope of disclosure. Excess portions of the at least one conductive material may be removed from above the horizontal plane including the top surfaces of the first gate electrodes 50 by a planarization process, which may use a chemical mechanical planarization process and/or a recess etch process. Each remaining portion of the at least one conductive material constitutes a source contact via structure 52. Each source contact via structure 52 may have a top surface within the horizontal plane including the top surfaces of the first gate electrodes 50.

Each combination of a source contact via structure 52 and a source isolation spacer 56 constitutes a laterally-insulated source contact structure (52, 56). Each laterally-insulated source contact structure (52, 56) may include a source contact via structure 52 contacting the source region 12 and extending along a direction perpendicular to the first major surface 301 and the second major surface 302 of the metal oxide semiconductor channel layers 30. Each laterally-insulated source contact structure (52, 56) may also include a source isolation spacer 56 surrounding the source contact via structure 52 and contacting a first gate electrode 50 and a first gate dielectric layer 40.

Each area of a unit cell UC includes a semiconductor device, which may be a semiconductor memory device including a dual channel field effect transistor. The semiconductor device may include a metal oxide semiconductor channel layer 30 having a thickness between a first major surface 301 and a second major surface 302 and extending between a first end surface 303 and a second end surface 304 that are spaced apart along a first direction (such as the first horizontal direction hd1). The metal oxide semiconductor channel layer 30 may connect respective edges of the first major surface 301 and the second major surface 302. The semiconductor device may also include a first gate dielectric layer 40 contacting a first portion of the second major surface 302 of the metal oxide semiconductor channel layer 30; a first gate electrode 50 overlying the first gate dielectric layer 40 and contacting a second portion of the second major surface 302 of the metal oxide semiconductor channel layer 30; a drain region 18 and a backside gate dielectric layer 22 contacting the first major surface 301 of the metal oxide semiconductor channel layer 30; a backside gate electrode 15 contacting the backside gate dielectric layer 22; a second gate dielectric layer 60 contacting the second end surface 304 of the metal oxide semiconductor channel layer 30; a second gate electrode 70 contacting a surface of the second gate dielectric layer 60; and a source region 12 contacting the first end surface 303 of the metal oxide semiconductor channel layer 30.

Referring to FIGS. 14A-14D, contact via cavities may be formed through the dielectric rails 90 down to a top surface of a respective one of the drain regions 18 and the backside gate electrodes 15. A combination of a lithographic patterning step using a photoresist layer and an anisotropic etch step may be used to form the contact via cavities. The contact via cavities may include drain contact via cavities that vertically extend to a respective one of the drain regions 18, and backside gate contact via cavities that vertically extend to a respective one of the backside gate electrodes 15.

At least one conductive material may be deposited in the contact via cavities, and may be planarized to form contact via structures (95, 98). The contact via structures (95, 98) include backside gate contact via structures 95 that contact a respective backside gate electrode 15, and drain contact via structures 98 that contact a respective drain region 18.

The pattern of the unit cell UC may be repeated along the second horizontal direction hd2 to provide at least one row of field effect transistors. Optionally, the pattern of a unit cell UC may be changed into a mirror image pattern in every other column that extends along the first horizontal direction hd1. Further, the pattern of a row of filed effect transistors may be repeated along the first horizontal direction hd1 to provide multiple rows of field effect transistors. Optionally, the pattern of a unit cell UC may be changed into a mirror image pattern in every other row that extends along the second horizontal direction hd2.

Generally, a semiconductor memory device comprising a plurality of field effect transistors is provided. Each field effect transistor selected from the plurality of field effect transistors may be located on an insulating matrix layer 20 that extends along a first direction (such as the first horizontal direction hd1) and a second direction (such as the second horizontal direction hd2) that is perpendicular to the first direction. Each field effect transistor in the plurality of field effect transistors may comprise: a metal oxide semiconductor channel layer 30 having a thickness along a third direction (such as the vertical direction) between a first major surface 301 and a second major surface 302, a drain region 18 and a backside gate dielectric layer 22 that are embedded in the insulating matrix layer 20 and contact the first major surface 301 of the metal oxide semiconductor channel layer 30, a backside gate electrode 15 embedded in the insulating matrix layer 20, a first gate dielectric layer 40 contacting a first portion of the second major surface 302 of the metal oxide semiconductor channel layer 30, and a first gate electrode 50 located on the first gate dielectric layer 40 and contacting a second portion of the second major surface 302 of the metal oxide semiconductor channel layer 30. The plurality of field effect transistors comprises at least one row of field effect transistors that are arranged along the second direction (such as the second horizontal direction hd2), and dielectric rails 90 contact metal oxide semiconductor channel layers 30 and first gate electrodes 50 of a respective neighboring pair of field effect transistors within each row of field effect transistors and provide lateral electrical isolation thereamongst. Each field effect transistor may comprise a source region 12 contacting a first end surface 303 of the metal oxide semiconductor channel layer 30. Further, field effect transistor may comprise a second gate dielectric layer 60 contacting a second end surface 304 of the metal oxide semiconductor channel layer 30, and a second gate electrode 70 contacting, and surrounded by, the second gate dielectric layer 60.

In one embodiment, the at least one row of field effect transistors comprises a plurality of rows of field effect transistors that are arranged along the first direction (such as the first horizontal direction hd1), and an array of second gate dielectric layers 60 is located between, and provides electrical isolation between, neighboring rows of field effect transistors, and each of the second gate dielectric layers 60 contacts an end surface (such as a second end surface 304) of a respective one of the metal oxide semiconductor channel layers 30 and surrounds a respective second gate electrode 70.

A first channel region and a second channel region may be formed during operation of a field effect transistor within a unit cell according to an embodiment of the present disclosure. The field effect transistor is a dual channel transistor device including two activatable channel regions. The first channel region is also referred to as a horizontal channel region. The first channel region corresponds to a region of the metal oxide semiconductor channel layer 30 within which electrical current may flow between the drain region 18 and the source region 12. The second channel region is also referred to as a vertical channel region. The second channel region corresponds to a region of the metal oxide semiconductor channel layer 30 within which electrical current may flow between the drain region 18 and the first gate electrode 50. At a circuit level, the dual channel transistor device comprises a horizontal channel transistor including the first channel region as a first channel, and a vertical channel transistor including the second channel region as a second channel.

Figure 15A:
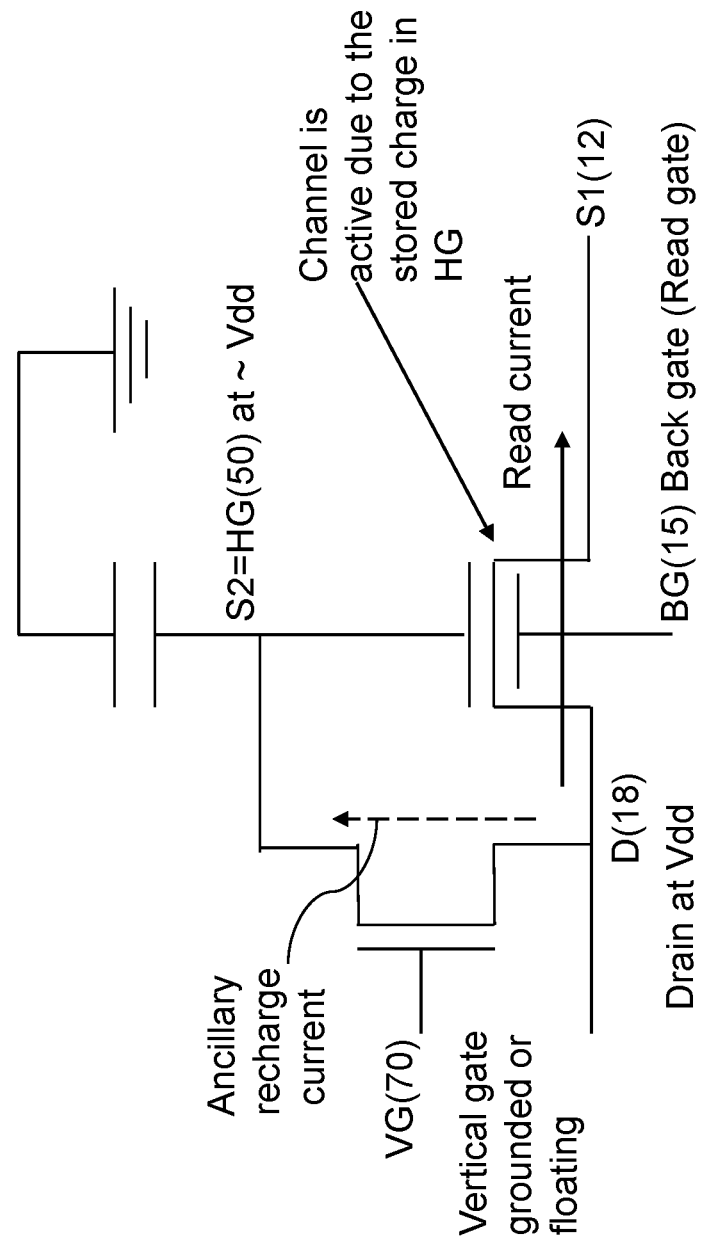
FIG. 15A is a schematic diagram that illustrates the configuration of a dual channel transistor device of the present disclosure during a read operation in embodiments in which electrical charges are stored in the first gate electrode according to an embodiment of the present disclosure.

Referring to FIG. 15A, the dual channel transistor device of the present disclosure is schematically illustrated during a read operation while being in a memory state in which electrical charges are stored in the first gate electrode 50, i.e., a state of "1" is encoded in the first gate electrode 50. A source region 12 of the first exemplary structure in FIGS. 14A-14D is represented as a first source region S1 for a horizontal channel transistor. A drain region 18 of the first exemplary structure in FIGS. 14A-14D is represented as a common drain region D for the horizontal channel transistor and for the vertical channel transistor. A first gate electrode 50 of the first exemplary structure in FIGS. 14A-14D is represented as a horizontal gate (HG) of the horizontal channel transistor. The first gate electrode 50 of the first exemplary structure in FIGS. 14A-14D also functions as a second source region S2 of the vertical channel transistor. A second gate electrode 70 of the first exemplary structure in FIGS. 14A-14D is represented as a vertical gate (VG) of the vertical channel transistor. The first gate electrode 50 of the first exemplary structure in FIGS. 14A-14D is electrically floating unless the vertical channel of the vertical channel transistor is activated, and functions as a first node of a capacitor. Electrical ground of electrically grounded components (such as the source region 12) functions as a second node of the capacitor. The backside gate electrode 15 of the first exemplary structure in FIGS. 14A-14D is represented as a back gate BG, which may be activated during a read operation to facilitate turning on the first channel. Thus, the back gate BG is also referred to as a read gate.

The horizontal channel transistor includes the source region 12 as a source region, the drain region 18 as a drain region, a horizontally extending portion of the metal oxide semiconductor channel layer 30 as a semiconductor channel, the first gate electrode 50 as a gate electrode, and the first gate dielectric layer 40 as a gate dielectric. The vertical channel transistor includes the first gate electrode 50 as a source region, the drain region 18 as a drain region, a surface portion of the metal oxide semiconductor channel layer 30 adjacent to a vertical interface between the second gate dielectric layer 60 as a semiconductor channel, the second gate electrode 70 as a gate electrode, and the second gate dielectric layer 60 as a gate dielectric.

During a read operation, the quantity of electrical charges in the first gate electrode 50 may be measured and determined by electrically grounding the source region 12, by applying a read voltage (such as a power supply voltage Vdd) to the drain region 18, and by measuring electrical current that flows between the drain region 18 and the source region 12. The back gate BG, comprising a backside gate electrode 15, provides a bias voltage that adjusts the threshold voltage of the first channel such that the first channel turns on only if the first gate electrode 50 is charged with electrical charges. If the first gate electrode 50 is charged with electrical charges (i.e., stores electrical charges after a programming operation that programs "1," i.e., a state in which electrical charges are present in the first gate electrode 50), the electrical charges in the first gate electrode 50 activates the horizontal semiconductor channel within the metal oxide semiconductor channel layer 30. The horizontal semiconductor channel in the metal oxide semiconductor channel layer 30 becomes conductive, and a read current flows between the drain region 18 and the source region 12. The non-zero read current may be detected by a sense amplifier, and the state of "1" may be measured and determined by the sense amplifier. The vertical gate electrode (i.e., the second gate electrode 70) may be electrically floating, or may be grounded during the read operation. Ancillary recharge current may flow through an edge portion of the metal oxide semiconductor channel layer 30 that are proximal to the second gate electrode 70 because the horizontal semiconductor channel is active. Thus, the read operation may recharge the "1" state and compensate for any gradual loss in the stored electrical charges in the first gate electrode 50.

Figure 15B:
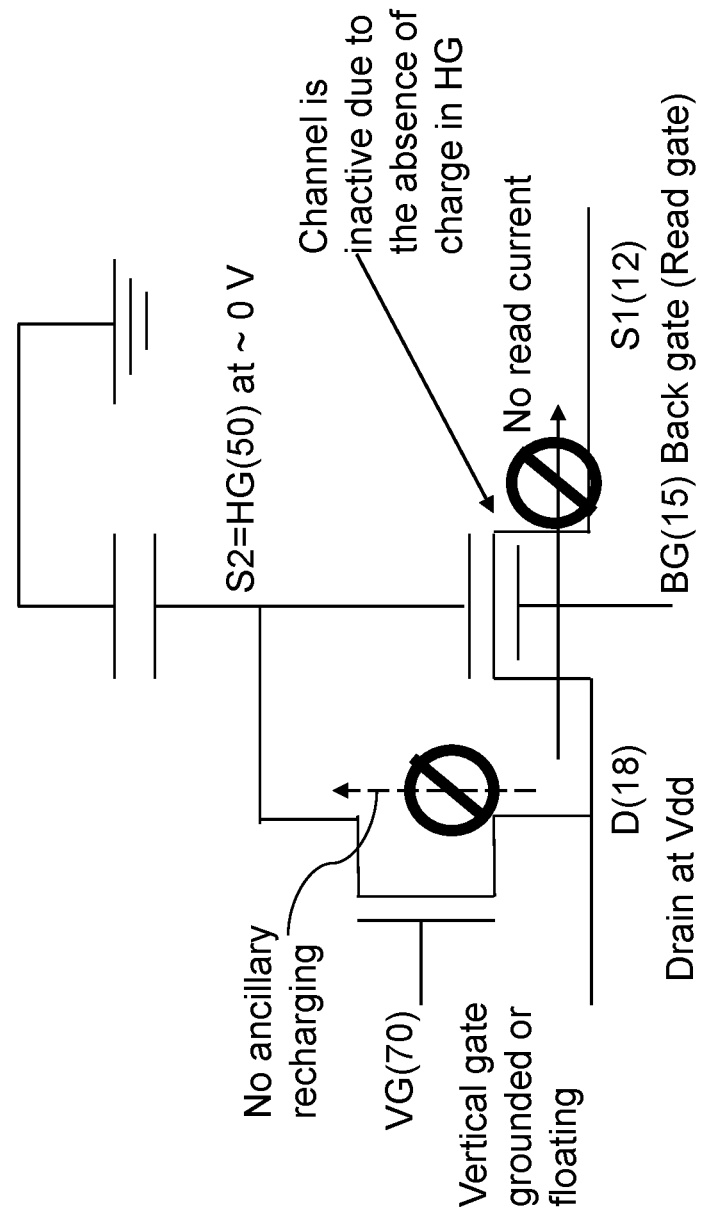
FIG. 15B is a schematic diagram that illustrates the configuration of the dual channel transistor device of the present disclosure during a read operation in embodiments in which electrical charges are not stored in the first gate electrode according to an embodiment of the present disclosure.

Referring to FIG. 15B, the dual channel transistor device of the present disclosure is schematically illustrated during a read operation in a memory state in which electrical charges are not stored in the first gate electrode 50, i.e., a state of "0" is encoded in the first gate electrode 50. If the first gate electrode 50 is not charged (i.e., stores no electrical charges after a programming operation that programs "0," i.e., a state in which electrical charges are absent in the first gate electrode 50), the horizontal semiconductor channel within the metal oxide semiconductor channel layer 30 is not activated during a read operation because electrical charges are absent in the first gate electrode 50. The horizontal semiconductor channel in the metal oxide semiconductor channel layer 30 remains insulating, and no read current flows between the drain region 18 and the source region 12. The zero read current may be detected by a sense amplifier, and the state of "0" may be measured and determined by the sense amplifier. The vertical gate electrode (i.e., the second gate electrode 70) may be electrically floating, or may be grounded during the read operation. Ancillary recharge current does not flow through the metal oxide semiconductor channel layer 30 because the metal oxide semiconductor channel layer 30 remains non-conductive. Thus, the read operation does not add any electrical charge to the first gate electrode 50, and the first gate electrode 50 remains at 0 V, i.e., the voltage of electrical ground.

Figure 16A:
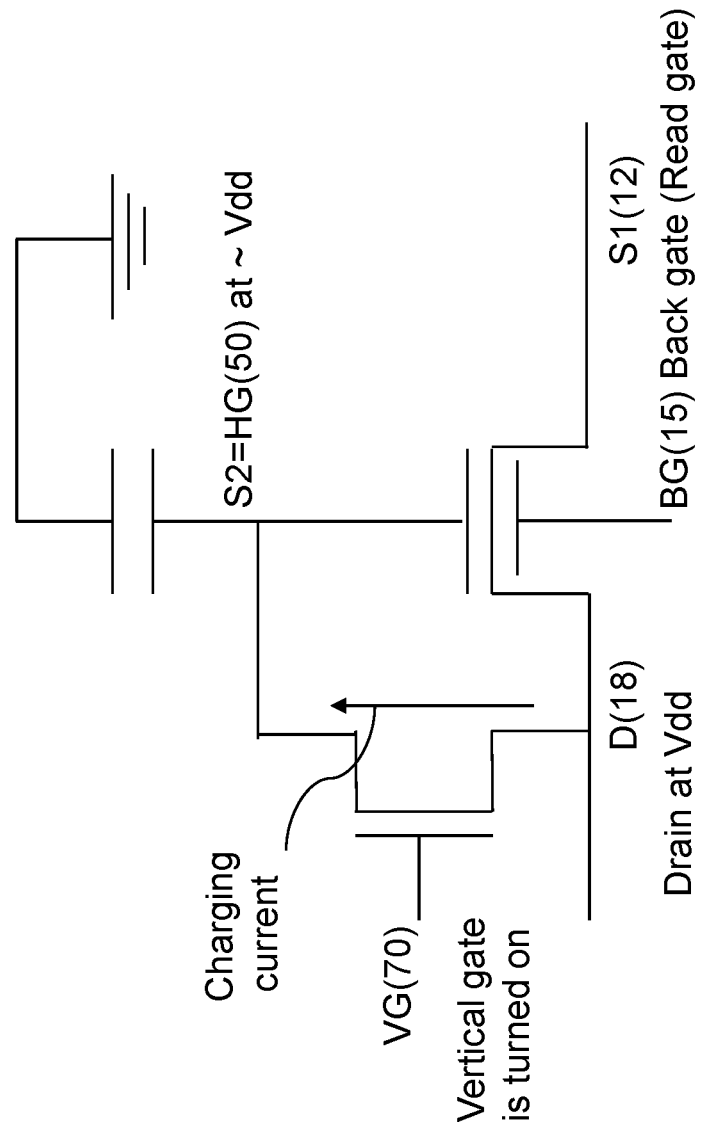
FIG. 16A is a schematic diagram that illustrates the configuration of a dual channel transistor device of the present disclosure during a write operation for writing "1" according to an embodiment of the present disclosure.

Referring to FIG. 16A, the dual channel transistor device of the present disclosure is schematically illustrated during a write (programming) operation for writing "1" according to an embodiment of the present disclosure. The first gate electrode 50 may be programmed into a charged state, i.e., a "1" state, by applying a non-zero programming voltage (such as a power supply voltage Vdd) to the drain region 18 and by applying a turn-on voltage to the second gate electrode 70 that activates a surface semiconductor channel in a surface portion of the metal oxide semiconductor channel layer 30. The surface semiconductor channel may be formed in proximity to an interface between the second gate dielectric layer 60 and the metal oxide semiconductor channel layer 30. Charging current flows through the surface semiconductor channel into the first gate electrode 50. The source region 12 may be electrically floating, or may be electrically grounded during the programming operation. The voltage on the back gate BG is immaterial for the writing operation for the "1" state.

Figure 16B:
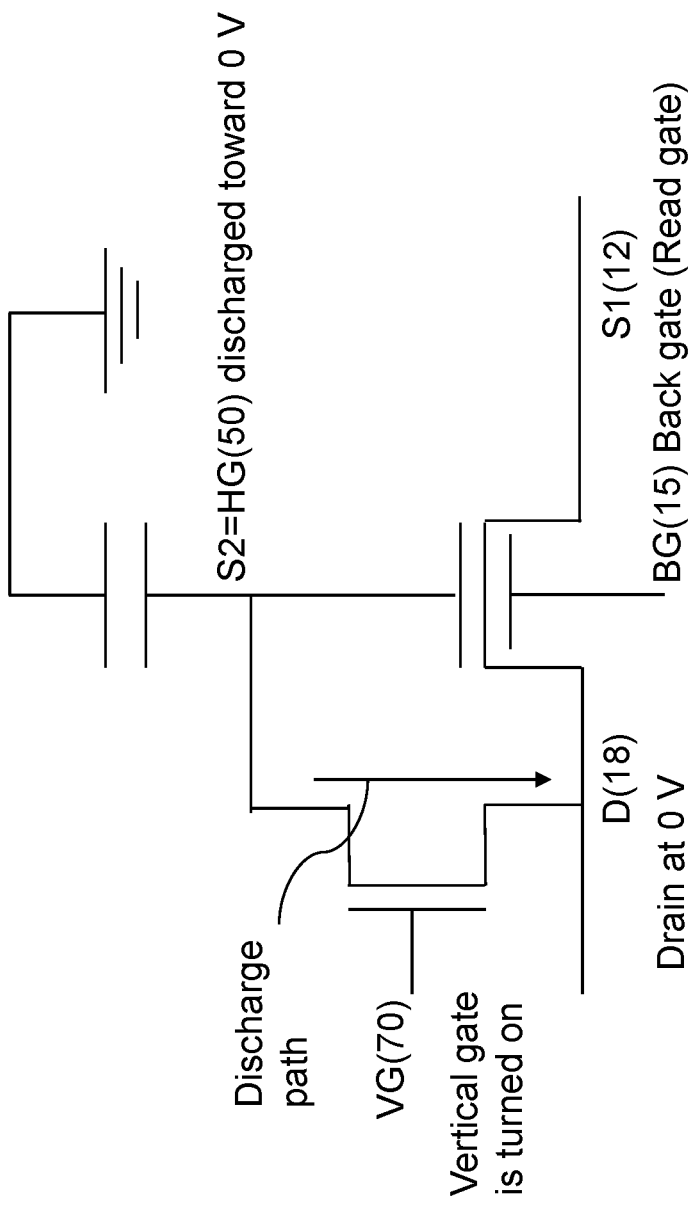
FIG. 16B is a schematic diagram that illustrates the configuration of the dual channel transistor device of the present disclosure during a write operation for writing "0" according to an embodiment of the present disclosure.

Referring to FIG. 16B, the dual channel transistor device of the present disclosure is schematically illustrated during a write (programming) operation for writing "0" according to an embodiment of the present disclosure. The first gate electrode 50 may be programmed into a non-charged state, i.e., a "0" state, by applying zero voltage to the drain region 18 and by applying a turn-on voltage to the second gate electrode 70 that activates a surface semiconductor channel in a surface portion of the metal oxide semiconductor channel layer 30. The surface semiconductor channel may be formed in proximity to an interface between the second gate dielectric layer 60 and the metal oxide semiconductor channel layer 30. Any electrical charge stored in the first gate electrode 50 may be drained through the surface semiconductor channel to the drain region 18 that is electrically grounded. Thus, the voltage at the first gate electrode 50 reaches 0 V, i.e., the voltage of electrical ground. The source region 12 may be electrically floating, or may be electrically grounded during the programming operation. The voltage on the back gate BG is immaterial for the writing operation for the "0" state.

Figure 17:
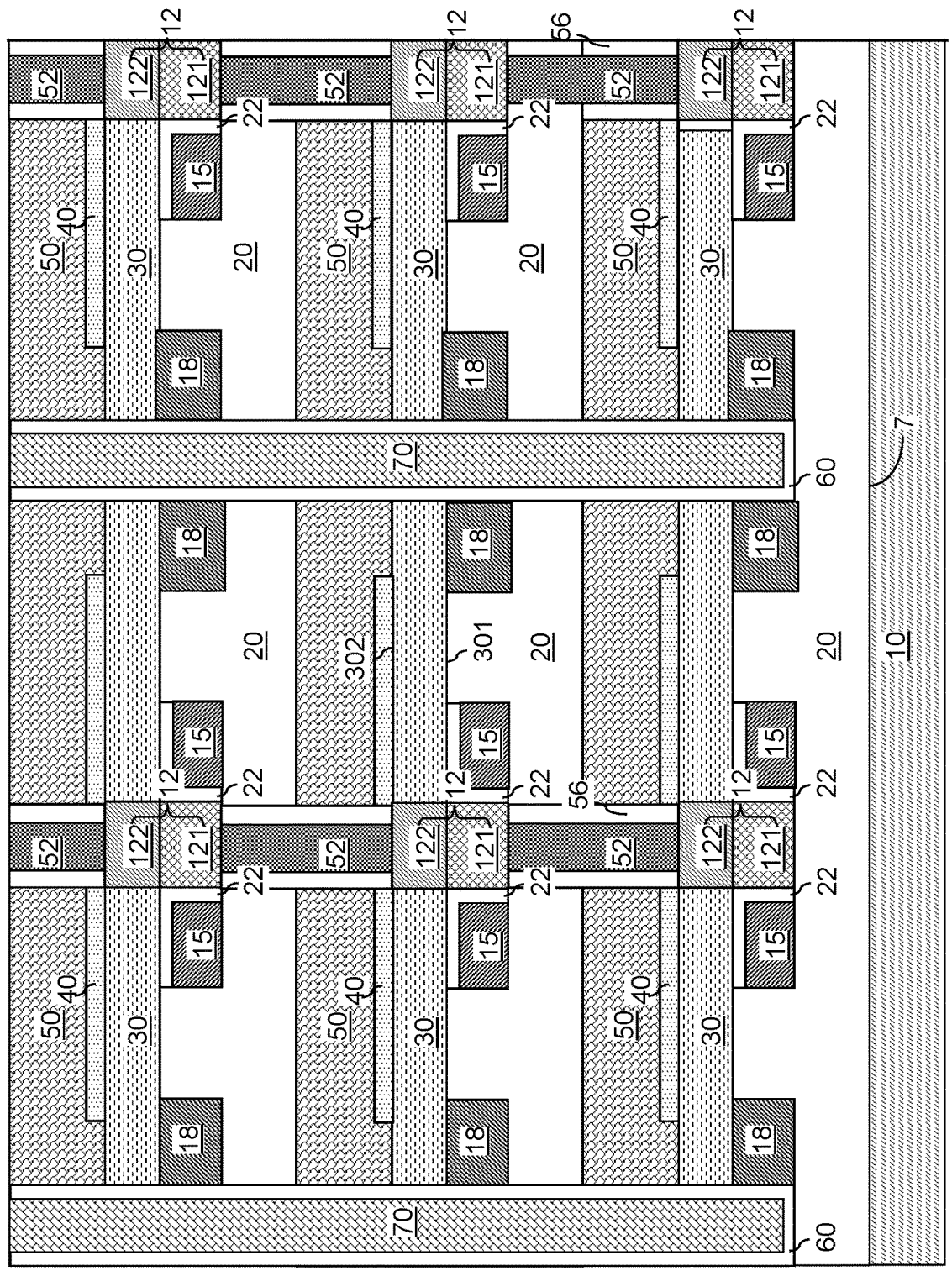
FIG. 17 is a vertical cross-sectional view of a second exemplary structure including a three-dimensional array of memory cells according to an embodiment of the present disclosure.

Referring to FIG. 17, a second exemplary structure according to an embodiment of the present disclosure includes a three-dimensional array of memory cells. Each memory cell incorporates a dual channel triple gate field effect transistor within the unit cell of the first exemplary structure of FIGS. 14A-14D. Each field effect transistor in a unit cell UC functions as a memory cell, and may be operated as described with reference to FIGS. 15A-16B.

In one embodiment, multiple instances of the two-dimensional array of memory cells may be stacked vertically over a substrate 10 to form a three-dimensional array of memory cells. The substrate 10 may be a semiconductor substrate, an insulating substrate, or a conductive substrate. Each instance of the two-dimensional array of memory cells may be stacked upright over a major surface 7 of the substrate 10. The major surfaces (301, 302) of each metal oxide semiconductor channel layers 30 may be parallel to the major surface 7 of the substrate 10. The end surface (303, 304) of each metal oxide semiconductor channel layers 30 may be perpendicular to the major surface 7 of the substrate 10

In one embodiment, vertically overlapping source contact via structures 52 may be vertically extended through an insulating matrix layer 20 to contact an overlying source region 12 and/or an underlying source region 12. In this embodiment, a vertical stack of multiple source regions 12 and multiple source contact via structures 52 may collectively form a source line (12, 52) that may extend along a direction that is perpendicular to major surfaces of the metal oxide semiconductor channel layers 30. In some embodiment, the various portions of the source regions 12 may be vertically extended in lieu of, or in addition to, vertical extension of the source contact via structures 52. Source isolation spacers 56 may be vertically extended as needed.

In one embodiment, vertically overlapping second gate electrodes 70 may be merged into a single second gate electrode 70, and a single second gate dielectric layer 60 may be formed in lieu of multiple second gate dielectric layers 60 that overlap vertically. In this embodiment, deep trenches vertically extending through multiple levels of insulating matrix layers 20 may be formed such that sidewalls of multiple drain regions 18 located at different levels are physically exposed, and a second gate dielectric material layer and at least one conductive fill material may be deposited in the deep trenches and may be subsequently planarized to provide a combination of a second gate dielectric layer 60 and a second gate electrode 70 that vertically extend through multiple levels. Other modifications to components of the memory cells may be performed as necessary.

Figure 18:
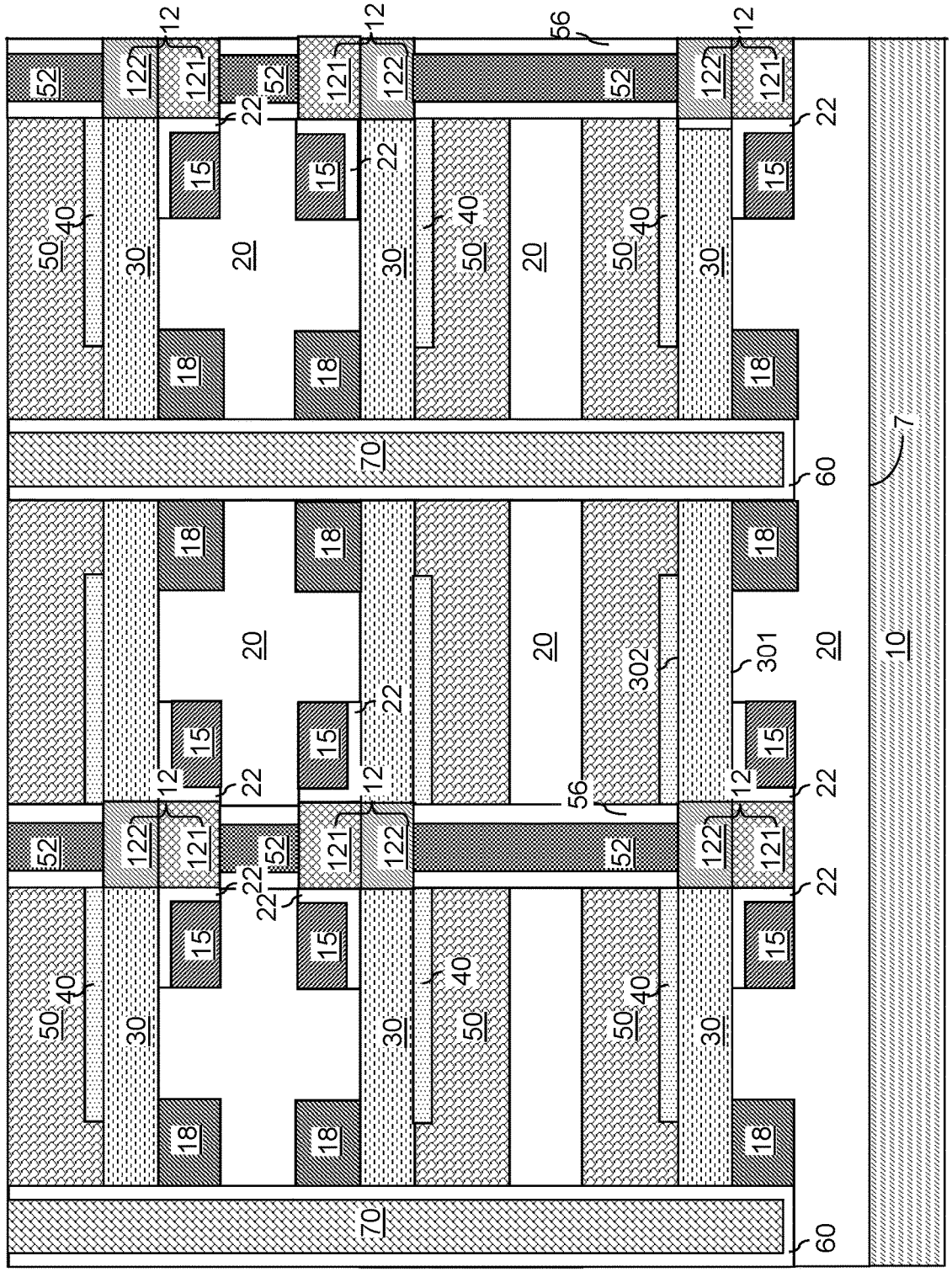
FIG. 18 is a vertical cross-sectional view of a third exemplary structure including a three-dimensional array of memory cells according to an embodiment of the present disclosure.

Referring to FIG. 18, a third exemplary structure according to an embodiment of the present disclosure includes a three-dimensional array of memory cells. In this embodiment, a two-dimensional array of memory cells within two vertically neighboring instances of the two-dimensional array of memory cells may be flipped upside down. For example, upon sequentially numbering all stacked two-dimensional arrays of memory cells with positive integers starting with 1, each odd-numbered instance of the two-dimensional array of memory cells may be formed upright, and each even-numbered instance of the two-dimensional array of memory cells may be formed upside down. Alternatively, each even-numbered instance of the two-dimensional array of memory cells may be formed upright, and each odd-numbered instance of the two-dimensional array of memory cells may be formed upside down. The major surfaces (301, 302) of each metal oxide semiconductor channel layers 30 may be parallel to the major surface 7 of the substrate 10.

In one embodiment, vertically overlapping source contact via structures 52 may be vertically extended through an insulating matrix layer 20 to contact an overlying source region 12 and/or an underlying source region 12, and to provide source lines (12, 52) that extend through multiple levels. In one embodiment, vertically overlapping second gate electrodes 70 may be merged into a single second gate electrode 70, and a single second gate dielectric layer 60 may be formed in lieu of multiple second gate dielectric layers 60 that overlap vertically.

Figure 19:
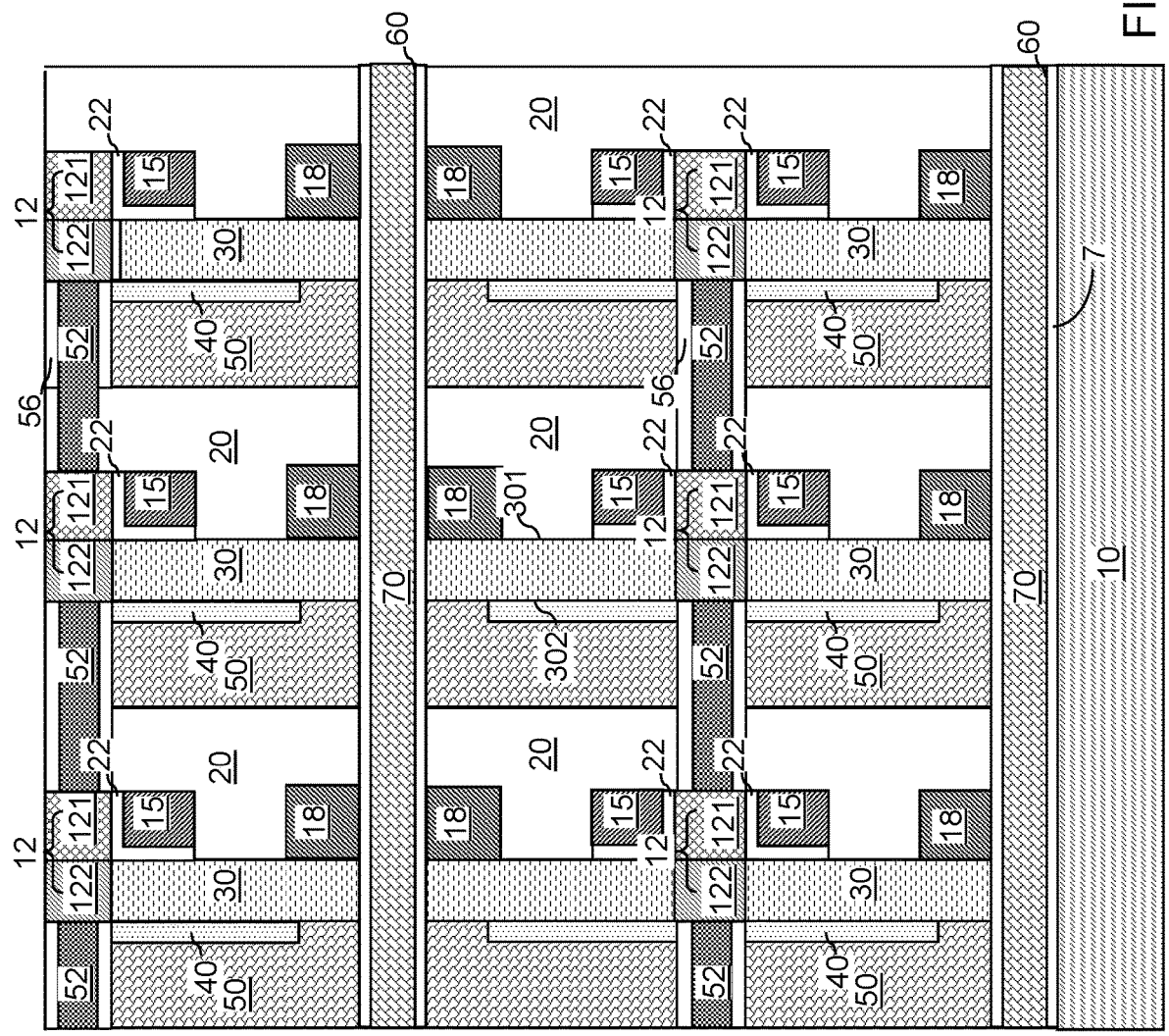
FIG. 19 is a vertical cross-sectional view of a fourth exemplary structure including a three-dimensional array of memory cells according to an embodiment of the present disclosure.

Referring to FIG. 19, a fourth exemplary structure according to an embodiment of the present disclosure includes a three-dimensional array of memory cells. The fourth exemplary structure may be formed by stacking multiple instances of a two-dimensional array of memory cells on a carrier substrate and transferring a stack of multiple instances of the two-dimensional array of memory cells onto a major surface of a substrate 10 such that the major surfaces of the metal oxide semiconductor channel layers 30 are perpendicular to the major surface of the substrate 10.

Alternatively, the fourth exemplary structure may be formed vertically by patterning and stacking various components of the fourth exemplary structure upward from the major surface 7 of the substrate 10. The major surfaces (301, 302) of each metal oxide semiconductor channel layers 30 may be perpendicular to the major surface 7 of the substrate 10. A same sequence of processing steps may be performed level by level. In one embodiment, instances of a memory cell may be repeated along a horizontal direction without any change in the pattern.

Figure 20:
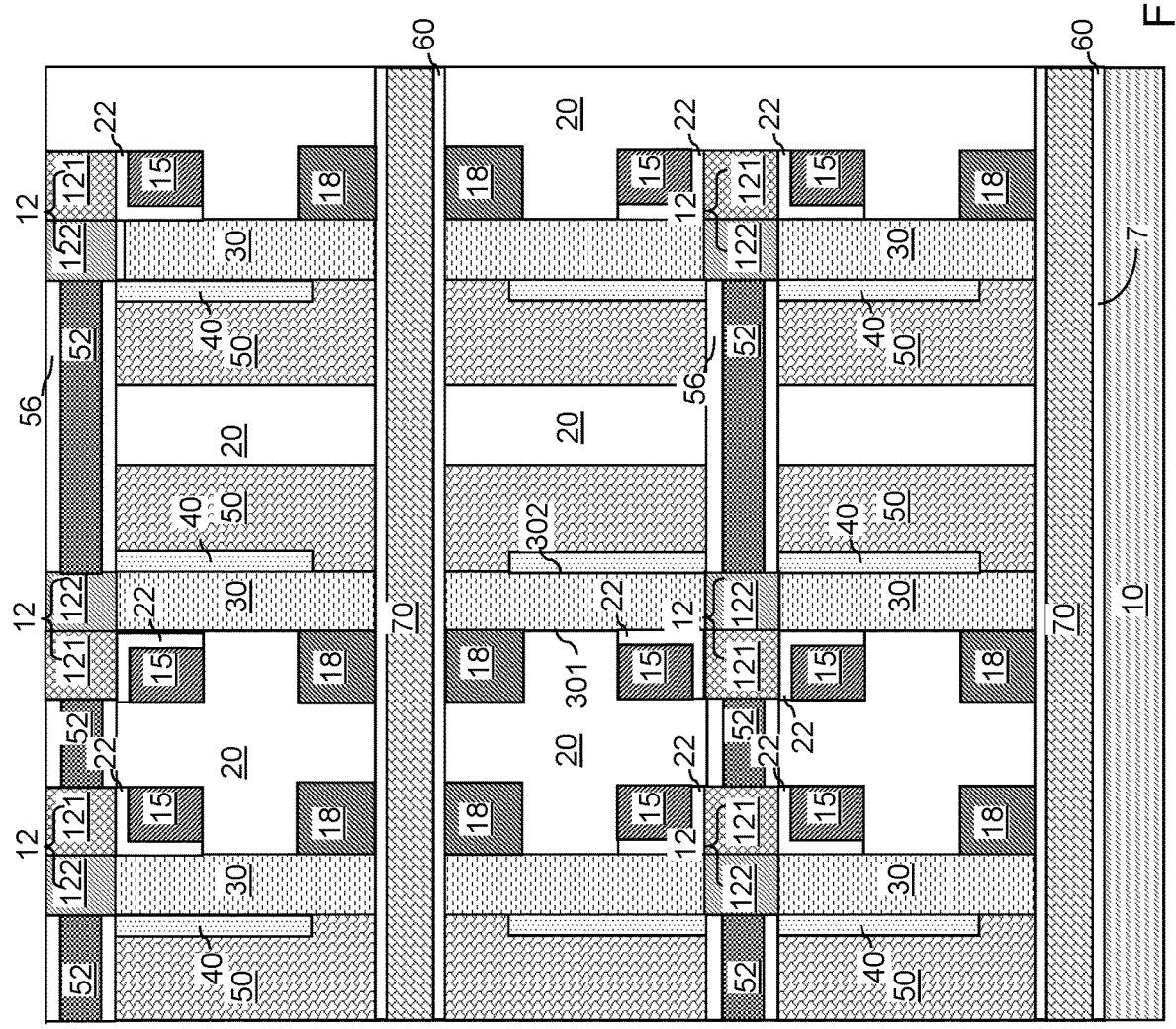
FIG. 20 is a vertical cross-sectional view of a fifth exemplary structure including a three-dimensional array of memory cells according to an embodiment of the present disclosure.

Referring to FIG. 20, a fifth exemplary structure according to an embodiment of the present disclosure includes a three-dimensional array of memory cells. The fifth exemplary structure may be formed in the same manner as the fourth exemplary structure. In one embodiment, instances of a memory cell may be repeated along a horizontal direction such that horizontally neighboring cells are mirror images of each other. The major surfaces (301, 302) of each metal oxide semiconductor channel layers 30 may be perpendicular to the major surface 7 of the substrate 10.

Referring collectively to FIGS. 1A-20 and according to various embodiments of the present disclosure, a semiconductor memory device comprising a plurality of field effect transistors is provided. Each field effect transistor selected from the plurality of field effect transistors may be located on an insulating matrix layer 20 that extends along a first direction (which is the channel direction contained within the major surfaces of the metal oxide semiconductor channel layers 30 and may be vertical or horizontal) and a second direction (which is a direction contained within the major surfaces of the metal oxide semiconductor channel layers 30 and perpendicular to the channel direction) that is perpendicular to the first direction. Each field effect transistor in the plurality of field effect transistors may comprise: a metal oxide semiconductor channel layer 30 having a thickness along a third direction (which is the direction that is perpendicular to the major surfaces of the metal oxide semiconductor channel layers 30) between a first major surface 301 and a second major surface 302, a drain region 18 and a backside gate dielectric layer 22 that are embedded in the insulating matrix layer 20 and contact the first major surface 301 of the metal oxide semiconductor channel layer 30, a backside gate electrode 15 embedded in the insulating matrix layer 20, a first gate dielectric layer 40 contacting a first portion of the second major surface 302 of the metal oxide semiconductor channel layer 30, and a first gate electrode 50 located on the first gate dielectric layer 40 and contacting a second portion of the second major surface 302 of the metal oxide semiconductor channel layer 30. The plurality of field effect transistors comprises at least one row of field effect transistors that are arranged along the second direction, and dielectric rails 90 contact metal oxide semiconductor channel layers 30 and first gate electrodes 50 of a respective neighboring pair of field effect transistors within each row of field effect transistors and provide lateral electrical isolation thereamongst. Each field effect transistor may comprise a source region 12 contacting a first end surface 303 of the metal oxide semiconductor channel layer 30. Further, field effect transistor may comprise a second gate dielectric layer 60 contacting a second end surface 304 of the metal oxide semiconductor channel layer 30, and a second gate electrode 70 contacting, and surrounded by, the second gate dielectric layer 60.

In some embodiments, the semiconductor memory device may comprise at least one an additional plurality of field effect transistors located on a respective additional insulating matrix layer 20 that extends along the first direction and the second direction and spaced from the plurality of field effect transistors by the at least one additional insulating matrix layer 20 along the third direction (which is the stacking direction). Each field effect transistor selected from the at least one additional plurality of field effect transistors comprises: a respective metal oxide semiconductor channel layer 30 having a thickness along the third direction between a respective first major surface 301 and a respective second major surface 302, a respective drain region 18 and a respective backside gate dielectric layer 22 that are embedded in an additional insulating matrix layer 20 and contact the respective first major surface 301 of the respective metal oxide semiconductor channel layer 30, a respective backside gate electrode 15 embedded in the additional insulating matrix layer 20, a respective first gate dielectric layer 40 contacting a first portion of the respective second major surface 302 of the respective metal oxide semiconductor channel layer 30, and a respective first gate electrode 50 located on the respective first gate dielectric layer 40 and contacting a second portion of the respective second major surface 302 of the metal oxide semiconductor channel layer 30.

In some embodiments, the semiconductor memory device may comprise a substrate 10 having a major surface 7. The first direction (which is the channel direction that is parallel to the major surfaces (301, 302) of the metal oxide semiconductor channel layers 30) and the second direction (which is a direction that is parallel to the major surfaces (301, 302) of the metal oxide semiconductor channel layers 30) may be parallel to the major surface 7 of the substrate 10, and the third direction (which is the thickness direction of the metal oxide semiconductor channel layers 30) may be perpendicular to the major surface 7 of the substrate 10 as illustrated in FIGS. 17 and 18. In one embodiment, one of the insulating matrix layer 20 and the at least one additional insulating matrix layer 20 contacts the major surface of the substrate 10, and another of the insulating matrix layer 20 and the at least one additional insulating matrix layer 20 is spaced from the substrate 10 along the third direction.

In some embodiments, the semiconductor memory device may comprise a substrate 10 having a major surface 7. The third direction (which is the thickness direction of the metal oxide semiconductor channel layers 30) and one of the first direction (which is the channel direction that is parallel to the major surfaces (301, 302) of the metal oxide semiconductor channel layers 30) and the second direction (which is a direction that is parallel to the major surfaces (301, 302) of the metal oxide semiconductor channel layers 30) are parallel to the major surface 7 of the substrate. Another of the first direction and the second direction is perpendicular to the major surface 7 of the substrate 10 as illustrated in FIGS. 18 and 20.

Figure 21:
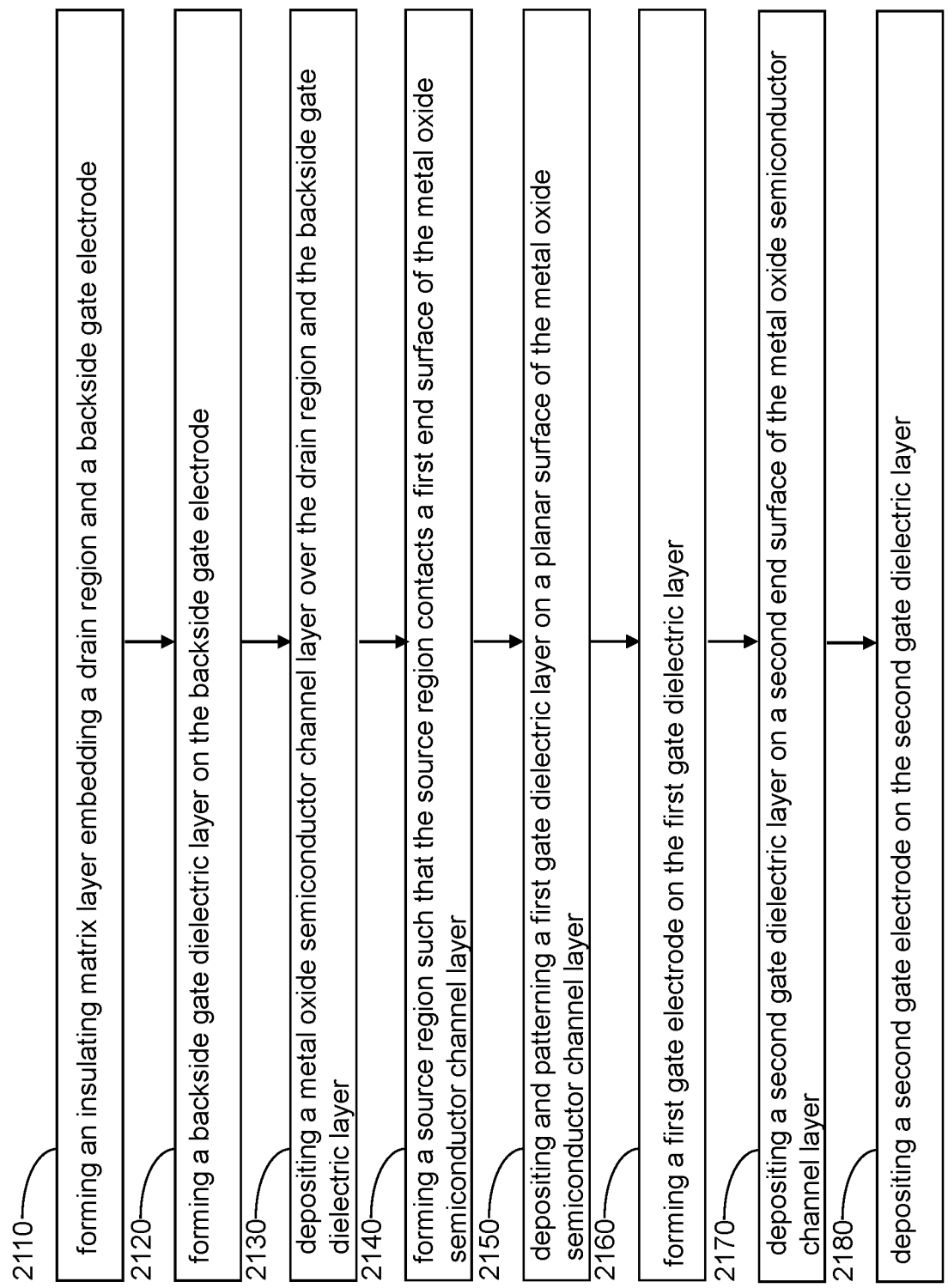
FIG. 21 is a flowchart illustrating steps for manufacture of the dual channel transistor device according to an embodiment of the present disclosure.

Referring to FIG. 21, a flowchart illustrates steps for manufacture of the dual channel transistor device according to an embodiment of the present disclosure. Referring to step 2110 and FIGS. 1A-4D, an insulating matrix layer 20 may be formed, wherein a drain region 18 and a backside gate electrode 15 may be embedded within the insulating matrix layer 20. Referring to step 2120 and FIGS. 5A-5D, a backside gate dielectric layer 22 may be formed on the backside gate electrode 15. Referring to step 2130 and FIGS. 6A-6D, a metal oxide semiconductor channel layer 30 may be deposited over the drain region 18 and the backside gate dielectric layer 22. Referring to step 2140 and FIGS. 7A-7D, a source region 12 may be formed such that the source region 12 contacts a first end surface 303 of the metal oxide semiconductor channel layer 30. Referring to step 2150 and FIGS. 8A-8D, a first gate dielectric material layer may be deposited and patterned on a major surface (such as the second major surface 302) of the metal oxide semiconductor channel layer 30 to form a first gate dielectric layer 40. Referring to step 2160 and FIGS. 9A-10D, a first gate electrode 50 may be formed on the first gate dielectric layer 40. Referring to step 2170 and FIGS. 11A-12D, a second gate dielectric layer 60 may be formed on a second end surface 304 of the metal oxide semiconductor channel layer 30. Referring to step 2180 and FIGS. 12A-12D, a second gate electrode 70 may be formed on the second gate dielectric layer 60. Additional processing steps illustrated in FIGS. 13A-14D and 18-20 may be performed as needed.

Referring to all drawings and according to various embodiments of the present disclosure, a semiconductor device is provided, which comprises a metal oxide semiconductor channel layer 30 having a thickness between a first major surface 301 and a second major surface 302 and extending between a first end surface 303 and a second end surface 304 that are spaced apart along a first direction (such as the first horizontal direction hd1) and connect respective edges of the first major surface 301 and the second major surface 302; a first gate dielectric layer 40 contacting a first portion of the second major surface 302 of the metal oxide semiconductor channel layer 30; a first gate electrode 50 overlying the first gate dielectric layer 40 and contacting a second portion of the second major surface 302 of the metal oxide semiconductor channel layer 30; a drain region 18 and a backside gate dielectric layer 22 contacting the first major surface 301 of the metal oxide semiconductor channel layer 30; a backside gate electrode 15 contacting the backside gate dielectric layer 22; a second gate dielectric layer 60 contacting the second end surface 304 of the metal oxide semiconductor channel layer 30; a second gate electrode 70 contacting a surface of the second gate dielectric layer 60; and a source region 12 contacting the first end surface 303 of the metal oxide semiconductor channel layer 30.

The various embodiments of the present disclosure may be used to manufacture and operate a dual channel memory device, or an "orthogonal channel" memory device in which a first gate electrode may be used as an electrically floating gate electrode that may be electrically connected to a drain region 18 only when a turn-on voltage is applied to a second gate electrode 70, which is the gate electrode of a vertical channel transistor within the dual channel memory device. The backside gate electrode may be used to adjust the threshold voltage for the horizontal channel in order to facilitate, and to improve the accuracy, of the read operation. The dual channel memory device does not use any charge tunneling, and thus, the reliability of the memory device is enhanced compared to memory devices that use a tunneling dielectric layer that suffers from charge trapping over usage. The dual channel memory device of the present disclosure may provide a small device footprint and high device reliability.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming an insulating matrix layer;
   embedding a drain region and a backside gate electrode in the insulating matrix layer;
   forming a backside gate dielectric layer on the backside gate electrode;
   depositing a metal oxide semiconductor channel layer over the drain region and the backside gate dielectric layer;
   forming a source region such that the source region contacts a first end surface of the metal oxide semiconductor channel layer;
   depositing and patterning a first gate dielectric material layer on a major surface of the metal oxide semiconductor channel layer; and
   forming a first gate electrode on the first gate dielectric layer.

2. The method of claim 1, further comprising depositing a second gate dielectric layer on a second end surface of the metal oxide semiconductor channel layer.

3. The method of claim 2, wherein the second end surface is a vertical surface.

4. The method of claim 2, further comprising a gate via cavity through the first gate electrode, the metal oxide semiconductor channel layer, and an upper portion of the insulating matrix layer, wherein the second end surface is a surface segment of a sidewall of the gate via cavity.

5. The method of claim 4, wherein the sidewall of the gate via cavity comprises a sidewall of the drain region.

6. The method of claim 2, further comprising depositing a second gate electrode on the second gate dielectric layer.

7. The method of claim 2, further comprising physically exposing surfaces of first gate electrode and the drain region by etching portions of the first gate electrode and the metal oxide semiconductor channel layer, wherein the second gate dielectric layer is formed on physically exposed surfaces of the first gate electrode and the drain region.

8. The method of claim 1, further comprising:
   forming a drain recess region in the insulating matrix layer; and
   depositing a conductive material in the drain recess region and a gate recess region, wherein a portion of the conductive material filling the drain recess region comprises the drain region.

9. The method of claim 1 further comprising:
   forming a gate recess region in the insulating matrix layer;
   depositing a conductive material in the gate recess region; and
   patterning a portion of the conductive material in the gate recess region, wherein a patterned portion of the conductive material in the gate recess region comprises the backside gate electrode.

10. The method of claim 1, further comprising:
    forming a first portion of the source region in a recess region in the insulating matrix layer adjacent to the backside gate dielectric layer, wherein the metal oxide semiconductor channel layer is formed over the first portion of the source region; and
    forming a second portion of the source region by doping a portion of the metal oxide semiconductor channel layer or by replacing a portion of the metal oxide semiconductor channel layer with a conductive material portion, wherein the second portion of the source region contacts the first portion of the source region.

11. The method of claim 1, wherein:
a portion of the major surface of the metal oxide semiconductor channel layer is physically exposed upon depositing and patterning the first gate dielectric material layer; and
the first gate electrode is formed directly on the physically exposed portion of the major surface of the metal oxide semiconductor channel layer and directly on the first gate dielectric layer.

12. A method of forming a semiconductor device, the method comprising:
forming a drain region, a backside gate electrode, a backside gate dielectric layer, and a first source portion in an upper portion of an insulating matrix layer;
forming a metal oxide semiconductor channel layer over the drain region, the backside gate dielectric, and the first source portion;
forming a first gate electrode over a horizontal top surface of the metal oxide semiconductor channel layer; and
forming a second gate electrode over a sidewall of the metal oxide semiconductor channel layer.

13. The method of claim 12, wherein the second gate electrode is formed over a sidewall of the drain region.

14. The method of claim 12, further comprising forming a gate via cavity having a straight sidewall extending from a bottom edge to a top edge through the first gate electrode, the metal oxide semiconductor channel layer, and an upper portion of the insulating matrix layer, wherein the sidewall of the metal oxide semiconductor layer and a sidewall of the drain region are exposed to the gate via cavity.

15. The method of claim 14, further comprising forming a second gate dielectric layer directly on the sidewall of the metal oxide semiconductor layer and the sidewall of the drain region.

16. The method of claim 12, further comprising forming a second source portion by doping a portion of the metal oxide semiconductor channel layer or by replacing a portion of the metal oxide semiconductor channel layer with a conductive material portion, wherein the second portion of a source region contacts the first portion of the source region.

17. A method of forming a semiconductor device, the method comprising:
forming a drain region, a backside gate electrode, a backside gate dielectric layer, and a first source portion in an upper portion of an insulating matrix layer;
forming a metal oxide semiconductor channel layer over the drain region, the backside gate dielectric, and the first source portion;
forming a second source portion by doping a portion of the metal oxide semiconductor channel layer or by replacing a portion of the metal oxide semiconductor channel layer with a conductive material portion, wherein the second portion of a source region contacts the first portion of the source region; and
forming a first gate electrode over a horizontal top surface of the metal oxide semiconductor channel layer.

18. The method of claim 17, further comprising:
forming a gate via cavity through the first gate electrode, the metal oxide semiconductor channel layer, and an upper portion of the insulating matrix layer;
forming a second gate dielectric layer and a second gate electrode in the gate via cavity.

19. The method of claim 18, wherein a sidewall of the drain region is exposed to the gate via cavity, wherein the second gate dielectric layer is formed on the sidewall of the drain region.

20. The method of claim 17, further comprising forming and patterning a first gate dielectric layer on the horizontal top surface of the metal oxide semiconductor channel layer, wherein:
a portion of the horizontal top surface of the metal oxide semiconductor channel layer is physically exposed; and
the first gate electrode is formed on the physically exposed portion of the horizontal top surface of the metal oxide semiconductor channel layer and on a top surface of the first gate dielectric layer.

* * * * *